US012628182B2

(12) United States Patent
Kim et al.

(10) Patent No.: US 12,628,182 B2
(45) Date of Patent: May 12, 2026

(54) USER EQUIPMENT PERFORMING BLIND DECODING AND OPERATING METHOD THEREOF

(71) Applicant: SAMSUNG ELECTRONICS CO., LTD., Suwon-si (KR)

(72) Inventors: Daeson Kim, Suwon-si (KR); Juhyuk Im, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 18/350,342

(22) Filed: Jul. 11, 2023

(65) Prior Publication Data

US 2024/0023134 A1 Jan. 18, 2024

(30) Foreign Application Priority Data

Jul. 14, 2022 (KR) ........................ 10-2022-0087090

(51) Int. Cl.
H04W 72/232 (2023.01)
H03M 13/11 (2006.01)
(Continued)

(52) U.S. Cl.
CPC ..... H04W 72/232 (2023.01); H03M 13/1108 (2013.01); H03M 13/13 (2013.01); H04L 1/0061 (2013.01)

(58) Field of Classification Search
CPC ............... H04W 72/232; H04W 72/23; H03M 13/1108; H03M 13/13; H03M 13/3723; H03M 13/3738; H03M 13/3715; H04L 1/0061; H04L 1/0052; H04L 1/0057; H04L 1/0038; H04L 1/0053; H04L 1/0054; H04L 1/0056; H04L 1/203
See application file for complete search history.

(56) References Cited

U.S. PATENT DOCUMENTS 9,762,352 B2 9/2017 Li et al.
10,312,946 B2 6/2019 Wang et al.
(Continued)

FOREIGN PATENT DOCUMENTS

CN 113938256 A * 1/2022 ............ H04W 52/02

OTHER PUBLICATIONS

Technical Specification, "5G; NR; Physical layer procedures for control (3GPP TS 38.213 version 16.8.0 Release 16)", ETSI TS 138 213 V16.8.0 (Jan. 2022), 192 pages.
(Continued)

*Primary Examiner* — Schquita D Goodwin
(74) *Attorney, Agent, or Firm* — Morgan, Lewis & Bockius LLP

(57) ABSTRACT

A method of wireless communication is described. A user equipment performs data communication based on a polar code with a base station by obtaining a physical downlink control channel (PDCCH) candidate from at least one search area in a frequency band for the data communication, performing error detection on frozen bits of the PDCCH candidate, determining whether the PDCCH candidate is a valid PDCCH candidate based on a result of the error detection, and selectively performing polar decoding on the PDCCH candidate based on a determination result of the valid PDCCH candidate.

19 Claims, 19 Drawing Sheets

(51) Int. Cl.
    *H03M 13/13*        (2006.01)
    *H04L 1/00*          (2006.01)

(56)              References Cited

U.S. PATENT DOCUMENTS

| | | | |
|---|---|---|---|
| 10,567,010 B2 | 2/2020 | Gross et al. | |
| 10,742,238 B2 | 8/2020 | Lin et al. | |
| 11,070,237 B2 | 7/2021 | Li et al. | |
| 11,184,028 B2 | 11/2021 | Zhou et al. | |
| 11,228,324 B2 | 1/2022 | Lin et al. | |
| 2017/0366199 A1* | 12/2017 | Ge | H03M 13/09 |
| 2018/0048418 A1* | 2/2018 | Ge | H04L 1/0038 |
| 2018/0331699 A1* | 11/2018 | Lin | H04L 1/0072 |
| 2019/0260391 A1 | 8/2019 | Hui et al. | |
| 2019/0327722 A1* | 10/2019 | Shelby | H04L 1/0072 |
| 2020/0067639 A1* | 2/2020 | Lin | H04L 1/0045 |
| 2020/0220662 A1* | 7/2020 | Park | H04W 72/0466 |
| 2020/0351014 A1 | 11/2020 | Takeda et al. | |
| 2021/0120560 A1* | 4/2021 | Kutz | H04L 1/0053 |
| 2021/0266015 A1 | 8/2021 | Choi et al. | |
| 2022/0337269 A1* | 10/2022 | Ma | H04L 1/0065 |

OTHER PUBLICATIONS

Technical Specification, "5G; NR; Radio Resource Control (RRC); Protocol specification (3GPP TS 38.331 version 16.7.0 Release 16)", ETSI TS 138 331 V16.7.0 (Jan. 2022), 950 pages.

\* cited by examiner

Radio frame (214)

Subframe (205)

. . .

Slot (206)

Resource element
(212)

N$_{BW}$
subcarriers
(204)

N$_{RB}$
subcarriers
(210)

Resource Block
(208)

N$_{symb}$ OFDM symbols
(202)

Frequency

Time

FIG. 3E

| SCS | 15 KHz | 30 KHz | 60 KHz | 120 KHz | 15 KHz | 30 KHz |
|---|---|---|---|---|---|---|
| Slot type | Slot | | | | Non-Slot | |
| Slot duration | 1000$\mu$s | 500$\mu$s | 250$\mu$s | 125$\mu$s | | |
| Min span duration | | | | | 142.86$\mu$s | 71.43$\mu$s |
| Max candidate number | 44 | 36 | 22 | 20 | 14 | 12 |

USER EQUIPMENT PERFORMING BLIND DECODING AND OPERATING METHOD THEREOF

CROSS-REFERENCE TO RELATED APPLICATION

This application is based on and claims priority under 35 U.S.C. § 119 to Korean Patent Application No. 10-2022-0087090, filed on Jul. 14, 2022, in the Korean Intellectual Property Office, the disclosure of which is incorporated by reference herein in its entirety.

BACKGROUND

The present disclosure relates to wireless communication, and particularly to a user equipment for performing blind decoding in an arbitrary network-based communication, and an operating method thereof.

A related downlink control information (DCI) supports transmission of downlink and uplink transmission channels in a communication system. The user equipment may receive a physical downlink control channel (PDCCH) from the base station, perform decoding on the PDCCH, and receive DCI based on the decoding result.

The PDCCH may include various formats and the user equipment may not determine the format selected by the base station in advance. Additionally, in the PDCCH, since a time/frequency resource defined as a search space may be transmitted through an arbitrary resource in a set, the exact time/frequency resource through which the PDCCH is transmitted is not determined in advance by the user equipment. In some cases, the PDCCH is decoded based on blind decoding.

Blind decoding refers to decoding performed by the user equipment on a plurality of PDCCH candidates with at least one control channel element (CCE) in a plurality of search spaces. The user equipment may determine that the DCI included in the corresponding PDCCH candidate is valid when a cyclic redundancy check (CRC) is passed in the process of decoding any one of the plurality of PDCCH candidates. Accordingly, the user equipment processes scheduling assignment, scheduling grant, and the like included in the corresponding DCI.

The number of PDCCH candidates may increase due to an increase in the number of search spaces in next generation communication. The time and power required for blind decoding in the user equipment increases accordingly, which limits the performance of the user equipment. Therefore, there is a need in the art for improved methods of decoding PDCCH candidates.

SUMMARY

The present disclosure describes a user equipment for improving power consumption and time required for blind decoding, and a method of operating the same. The user equipment may determine valid physical downlink control channel (PDCCH) candidates from among the PDCCH candidates and perform selective blind decoding on the valid PDCCH candidates.

According to an aspect of the present disclosure, a method of a user equipment performing data communication based on a polar code with a base station is provided, including obtaining a PDCCH candidate from at least one search area in a frequency band for the data communication, performing error detection on frozen bits of the PDCCH candidate, determining whether the PDCCH candidate is a valid PDCCH candidate based on a result of the error detection, and selectively performing polar decoding on the PDCCH candidate based on a determination result of the valid PDCCH candidate.

According to another aspect of the present disclosure, a user equipment including a transceiver configured to receive data based on a polar code from a base station and a processor is provided. The user equipment is configured to perform error detection on frozen bits of a PDCCH candidate, determine whether the PDCCH candidate is a valid PDCCH candidate based on a result of the error detection, and perform selective polar decoding on the PDCCH candidate based on a determination result of the valid PDCCH candidate to obtain downlink control information from the data.

According to another aspect of the present disclosure, a method of a user equipment performing data communication based on a polar code with a base station including performing polar code-based error detection for each of a plurality of physical downlink control channel (PDCCH) candidates for obtaining DCI for the data communication, determining valid PDCCH candidates from among the plurality of PDCCH candidates based on a result of the error detection, and performing blind decoding on the valid PDCCH candidates.

According to another aspect of the present disclosure, a user equipment receives a plurality of PDCCH candidates from a base station. In some cases, the user equipment performs frozen bit error detection on the plurality of PDCCH candidates to obtain a frozen bit error ratio (FBER). Further, the user equipment selects a valid PDCCH candidate from the plurality of PDCCH candidates based on the FBER and decodes the valid PDCCH candidate.

In some aspects, the method comprises performing a regenerated frozen bit error detection on the plurality of PDCCH candidates to obtain a regeneration frozen bit error ratio (RFBER), wherein the valid PDCCH candidate is selected based on the RFBER. In some aspects, the method further comprises measuring a log-likelihood ratio (LLR) quality for the plurality of PDCCH candidates, wherein the valid PDCCH candidate is selected based on the LLR quality.

Other features and aspects will be apparent from the following detailed description, the drawings, and the claims.

BRIEF DESCRIPTION OF THE DRAWINGS

Embodiments of the present disclosure will be more clearly understood from the following detailed description taken in conjunction with the accompanying drawings in which:

FIG. 3E is a table illustrating the maximum number of PDCCH candidates based on subcarrier spacing in a single cell;

DETAILED DESCRIPTION

Figure 1:
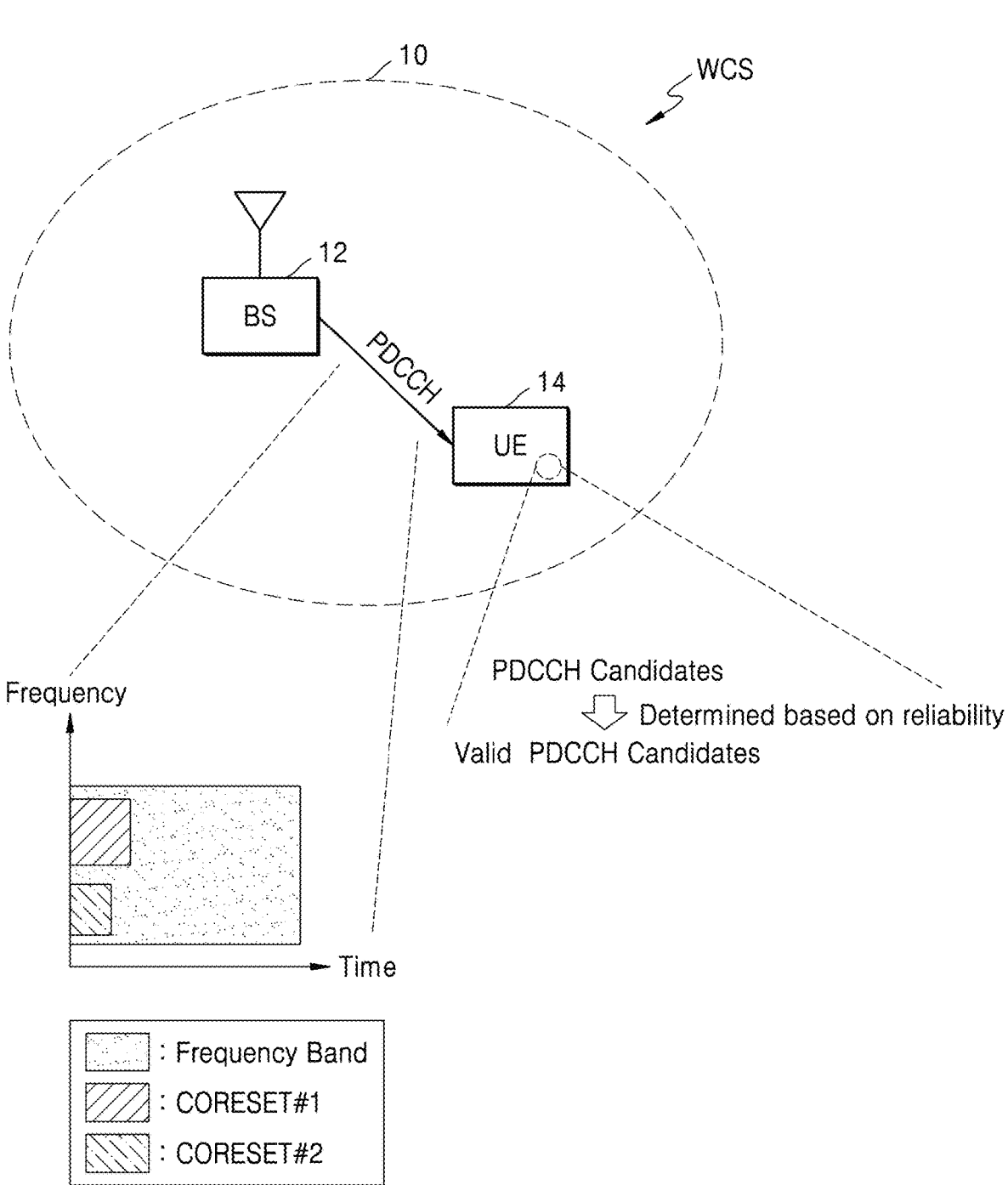
FIG. 1 is a diagram illustrating a wireless communication system according to an embodiment.

The present disclosure relates to a wireless communication system. Embodiments of the present disclosure include a base station (BS) and a user equipment (UE) of a wireless communication system. One or more embodiments of the present disclosure include a user equipment for improving power consumption and time required for blind decoding, and a method of operating the same. The user equipment may determine valid physical downlink control channel (PDCCH) candidates from among the PDCCH candidates and perform selective blind decoding on the valid PDCCH candidates.

Conventional user equipment performs blind decoding on a plurality of PDCCH candidates to receive DCI from the base station. Recent NR network-based communication include high-speed communication causing the amount of data to be processed for a certain period of time to be increased significantly compared to LTE network-based communication. Therefore, performing blind decoding on all PDCCH candidates may be a burden on user equipment in terms of power and load.

By contrast, the present disclosure describes systems and methods for selective blind decoding on valid PDCCH candidates. Embodiments of the present disclosure include receiving a plurality of PDCCH candidates from a base station. In some cases, the user equipment performs frozen bit error detection on the plurality of PDCCH candidates to obtain a frozen bit error ratio (FBER). Further, the user equipment selects a valid PDCCH candidate from the plurality of PDCCH candidates based on the FBER and decodes the valid PDCCH candidate.

Embodiments of the present disclosure include a user equipment that determines valid PDCCH candidates from among the PDCCH candidates and performs selective blind decoding on the valid PDCCH candidates. Embodiments of the present disclosure include different methods in which the user equipment determines valid PDCCH candidates. In some cases, the user equipment generates a frozen bit error ratio (FBER) to determine whether a PDCCH candidate is a valid PDCCH candidate based on the FBER.

According to some embodiments, the user equipment generates regenerated FBER (RFBER) to reduce the error propagation in FBER and increase the accuracy. The user equipment determines whether the PDCCH candidate is a valid PDCCH candidate based on the RFBER. Additionally, the user equipment may determine whether the PDCCH candidate is a valid PDCCH candidate based on the quality of the LLR of the PDCCH candidate. Therefore, selective blind decoding is performed on the valid PDCCH candidates which significantly reduces the power and load on the user equipment resulting in high-speed data processing.

The present disclosure may be modified in multiple alternate forms, and thus specific embodiments will be exemplified in the drawings and described in detail. In the present specification, when a component (or a region, a layer, a portion, etc.) is referred to as being "on," "connected to," or "coupled to" another component, it means that the component may be directly disposed on/connected to/coupled to the other component, or that a third component may be disposed therebetween.

Like reference numerals may refer to like components throughout the specification and the drawings. It is noted that while the drawings are intended to illustrate actual relative dimensions of a particular embodiment of the specification, the present disclosure is not necessarily limited to the embodiments shown. The term "and/or" includes all combinations of one or more of which associated configurations may define.

It will be understood that, although the terms "first," "second," etc. may be used herein to describe various components, these components should not necessarily be limited by these terms. These terms are only used to distinguish one component from another. For example, a first component could be termed a second component, and, similarly, a second component could be termed a first component, without departing from the scope of the inventive concept. The terms of a singular form may include plural forms unless the context clearly indicates otherwise.

Additionally, terms such as "below," "under," "on," and "above" may be used to describe the relationship between components illustrated in the figures. The terms are used as a relative concept and are described with reference to the direction indicated in the drawings. It should be understood that the terms "comprise," "include," or "have" are intended to specify the presence of stated features, integers, steps, operations, components, parts, or combinations thereof in the disclosure, but do not preclude the presence or addition of one or more other features, integers, steps, operations, components, parts, or combinations thereof.

Embodiments of the present disclosure include a new radio (NR) network-based carrier service. For example, the carrier service may be a wholesale carrier service (WCS), particularly the 3GPP release. The present disclosure is not limited to the NR network and may be applied to other wireless communication systems having a similar technical background or channel configuration, for example, long term evolution (LTE), LTE-advanced (LTE-A), wireless broadband (WiBro), global system for mobile communication (GSM), cellular communication systems, such as next-generation communication, such as 6G, or short-distance communication systems, such as Bluetooth and near field communication (NFC), etc.

Additionally, various functions described below may be implemented or supported by artificial intelligence technology or one or more computer programs, each of which consists of computer-readable program code and is embodied in a computer-readable medium. The terms "application" and "program" refer to one or more computer programs, software components, sets of instructions, procedures, functions, objects, classes, instances, associated data, or portions thereof suitable for implementation of suitable computer-readable program code. The term "computer-readable program code" includes computer code of any type, including source code, object code, and executable code. The term "computer-readable medium" includes any tangible medium that may be accessed by a computer, such as read only memory (ROM), random access memory (RAM), a hard disk drive, a compact disk (CD), a digital video disk (DVD), or any other type of memory. "Non-transitory" computer-readable media exclude wired, wireless, optical, or other communication links that transmit transitory electrical or other signals. The non-transitory computer-readable media include media in which data may be permanently stored, and media in which data may be stored and later overwritten, such as a rewritable optical disk or a removable memory device.

In the embodiments of the present disclosure described below, a hardware approach is described as an example. However, because embodiments of the inventive concept include technology using both hardware and software, the embodiments of the inventive concept do not exclude a software-based approach.

Hereinafter, a wireless communication system of an embodiment is described with reference to the accompanying drawings, wherein a user equipment determines valid PDCCH candidates from among the PDCCH candidates and performs selective blind decoding on the valid PDCCH candidates.

FIG. 1 is a block diagram illustrating a wireless communication system (WCS) according to an embodiment.

Referring to FIG. 1, the WCS may include base station 12 and user equipment 14. Base station 12 may refer to a fixed station that communicates with user equipment 14 and/or other base stations (not shown), and may exchange control information and data by communicating with user equipment 14 and/or other cells (not shown). For example, base station 12 may be referred to as a Node B, an evolved-Node B (eNB), a next generation Node B (gNB), a sector, a site, a base Transceiver System (BTS), an access point (AP), a relay node, a remote radio head (RRH), a radio unit (RU), a small cell, a wireless device, and the like.

According to the embodiments of the present disclosure, a wireless network may include a number of base stations and other network entities. A base station (BS) may be a station that communicates with UE. Each base station may provide communication coverage for a particular geographic area. In 3GPP, the term "cell" can refer to a coverage area of the base station and/or a coverage area depending on the context in which the term is used. In NR systems, the term "cell" and NB, next generation NB (gNB), 5G NB, access point (AP), BS, NR BS, or transmission reception point (TRP) may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network through various types of backhaul interfaces such as a direct physical connection, a virtual network, or the like using any suitable transport network.

User equipment 14 may be fixed or mobile, and may refer to any devices capable of communicating with base station 12 to transmit and receive data and/or control information. For example, user equipment 14 may be referred to as a terminal, terminal equipment, a mobile station (MS), a mobile terminal (MT), a user terminal (UT), a subscriber station (SS), a wireless device, a handheld device, and the like.

Base station 12 may provide wireless broadband access to user equipment 14 within coverage 10 thereof. Base station 12 may transmit a PDCCH including DCI to user equipment 14 to provide the DCI to user equipment 14. Base station 12 may set a first core set CORESET #1 and a second core set CORESET #2 in a frequency band for communication with user equipment 14.

As an example shown in FIG. 1, the frequency band may correspond to a single cell (or a single serving cell). The core sets CORESET #1 and CORESET #2 refer to resources set in time-frequency so that user equipment 14 may perform blind decoding on PDCCH candidates in a plurality of search spaces. For example, a plurality of search areas may exist in each of the first core set CORESET #1 and the second core set CORESET #2, and at least one PDCCH candidate may exist in one search area. However, in FIG. 1, only two core sets CORESET #1 and CORESET #2 are shown for convenience of description, but this is only an example embodiment, and the inventive concept is not limited thereto. More or fewer core sets may be set in a frequency band. More core sets (not shown) may exist in frequency bands that correspond to more cells. According to some embodiments, some of the plurality of search areas of the core sets CORESET #1 and CORESET #2 may be set to be selectively blind decoded.

According to an embodiment, the user equipment may determine valid PDCCH candidates based on reliability among a plurality of PDCCH candidates existing in the first core set CORESET #1 and the second core set CORESET #2. In some cases, the reliability refers to a degree to which DCI included in a PDCCH candidate is expected to be valid for each PDCCH candidate. For example, reliability may be generated using a method depending on a coding scheme based on data communication between the base station and the user equipment or the quality of log likelihood ratios (LLRs) of PDCCH candidates.

One or more embodiments of the present disclosure include a base station and a user equipment configured to perform data communication based on a polar code. Additionally, the present disclosure may be applied to data communication based on other coding schemes. In some examples, the PDCCH candidate may be a data set composed of at least one CCE, and may be a polar code encoded by base station 12. Additionally, the LLR of the PDCCH candidate refers to a PDCCH candidate having an LLR form. In some cases, the LLR of the PDCCH candidate may be generated by applying a predetermined log likelihood function to the PDCCH candidate.

According to an embodiment, the user equipment may perform polar code-based error detection for each of the plurality of PDCCH candidates, may determine valid PDCCH candidates from among a plurality of PDCCH candidates based on the error detection result, and may perform blind decoding on valid PDCCH candidates. In some cases, the polar code-based error detection may include an operation of counting the number of errors of frozen bits of PDCCH candidates to generate frozen bit error ratios (FBERs) of PDCCH candidates. User equipment 14 may determine valid PDCCH candidates from among a plurality of PDCCH candidates by using the FBERs. Further details regarding a method of operation of a base station and a user equipment based on FBERs are described below with reference to FIGS. 4 and 5.

According to an embodiment, the polar code based error detection may further include an operation of generating regenerated frozen bit error ratios (RFBERs) of the PDCCH candidates. Additionally, user equipment may use RFBERs to determine valid PDCCH candidates from among a plurality of PDCCH candidates. Further details regarding a method of operation of a base station and a user equipment based on RFBERs are described below with reference to FIGS. 9 and 10.

According to an embodiment, the user equipment measures the LLR quality of a plurality of PDCCH candidates and determines valid PDCCH candidates from among the plurality of PDCCH candidates based on the measurement result. In some cases, user equipment 14 may determine some of the plurality of PDCCH candidates as valid PDCCH candidates by preferentially considering the LLR quality of the PDCCH candidates. Additionally, the user equipment determines valid PDCCH candidates from among the remaining PDCCH candidates based on the polar code-based error detection.

According to an embodiment, the user equipment may determine valid PDCCH candidates based on the power state and may turn on/off a function of selectively performing blind decoding on the valid PDCCH candidates. For example, user equipment 14 may turn on the selective blind decoding function when the power state is less than the threshold. User equipment 14 may turn off the selective blind decoding function when the power state is equal to or greater than the threshold and perform blind decoding on the PDCCH candidates.

In some cases, user equipment 14 may provide base station 12 with performance information including information indicating that the selective blind decoding is possible. Base station 12 may recognize that the selective blind decoding of user equipment 14 is possible with reference to the performance information. In some cases, the base station allocates the DCI to the resource in a scheduling method suitable for the selective blind decoding.

User equipment 14 may generate reliability for a plurality of candidates based on a method conforming to a coding scheme applied to communication with base station 12. Additionally, the user equipment may effectively determine valid PDCCH candidates from among the plurality of PDCCH candidates based on the reliability. The user equipment may improve the overall performance thereof by effectively reducing the time and power consumed for blind decoding by performing the selective blind decoding on valid PDCCH candidates.

According to an embodiment of the disclosure, a method of wireless communication may include receiving a plurality of PDCCH candidates from a base station, performing frozen bit error detection on the plurality of PDCCH candidates to obtain an FBER, selecting a valid PDCCH candidate from the plurality of PDCCH candidates based on the FBER, and decoding the valid PDCCH candidate based on the selection.

Figure 2:
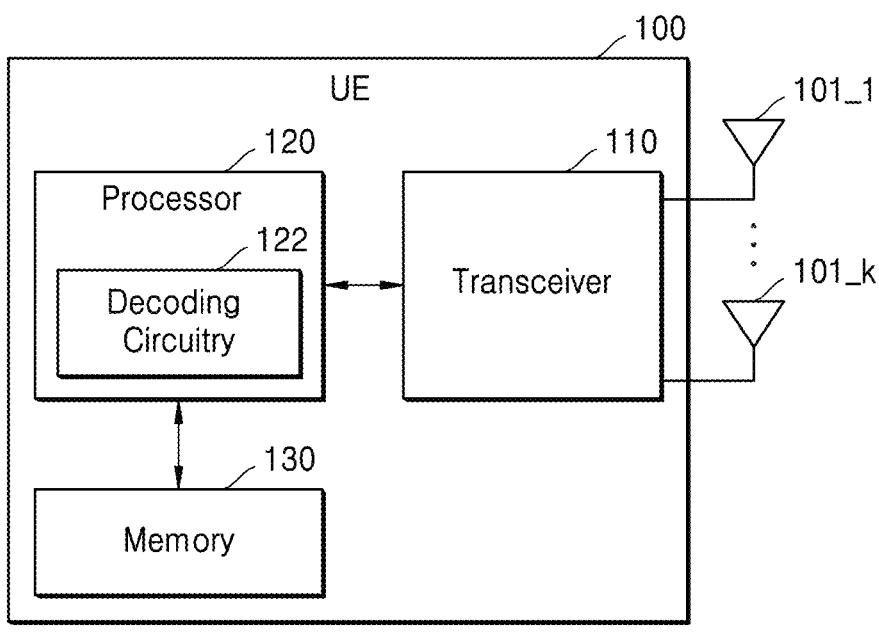
FIG. 2 is a diagram illustrating an implementation of a user equipment according to an embodiment.

FIG. 2 is a block diagram illustrating an implementation of user equipment 100. The implementation example of user equipment 100 as shown in FIG. 2 may be applied to user equipment 14 described with reference to FIG. 1.

Referring to FIG. 2, user equipment 100 may include a plurality of antennas 101_1 to 101_k, transceiver 110, processor 120, and memory 130.

Antennas 101_1 to 101_k refer to a wireless device that may include a single antenna or more than one antenna. For example, the antenna may be capable of concurrently transmitting or receiving multiple wireless transmissions. In some cases, a wireless communication device may include an antenna array.

Transceivers may communicate bi-directionally, via antennas, wired, or wireless links. For example, the transceiver may represent a wireless transceiver and may communicate bi-directionally with another wireless transceiver. The transceiver may also include or be connected to a modem to modulate the packets and provide the modulated packets to for transmission, and to demodulate received packets. In some examples, transceiver may be tuned to operate at specified frequencies. For example, a modem can configure the transceiver to operate at a specified frequency and power level based on the communication protocol used by the modem.

Transceiver 110 may receive RF signals transmitted by the base station through antennas 101_1 to 101_k. The transceiver may down-convert the received RF signals to generate intermediate frequency or baseband signals. Processor 120 may generate data signals by filtering, decoding, and digitizing intermediate frequency or baseband signals. The processor may perform a predetermined operation based on the data signals.

Processor is an intelligent hardware device, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor is configured to operate a memory array using a memory controller. In other cases, a memory controller is integrated into the processor. In some cases, the processor is configured to execute computer-readable instructions stored in a memory to perform various functions. In some embodiments, a processor includes special purpose components for modem processing, baseband processing, digital signal processing, or transmission processing.

Additionally, the processor may encode, multiplex, and analog data signals generated through a predetermined operation. The transceiver may frequency up-convert the intermediate frequency or baseband signals output from the processor and transmit them as RF signals through the plurality of antennas.

However, this is only an exemplary embodiment and the components of the user equipment are not limited thereto. Accordingly, the user equipment may further include an additional integrated circuit (not shown) configured to perform a part of the operation of the processor described above.

The processor includes decoding circuitry 122. In some cases, the decoding circuitry may perform blind decoding. An operation of the decoding circuitry may be interpreted as an operation of processor 120. According to some embodiments of the present disclosure, the decoding circuitry may be implemented in hardware or stored in memory 130 as program code executed by processor 120 to perform blind decoding according to embodiments.

Memory 130 refers to memory devices. Examples of a memory device include random access memory (RAM), read-only memory (ROM), or a hard disk. Examples of memory devices include solid state memory and a hard disk drive. In some examples, memory is used to store computer-readable, computer-executable software including instructions that, when executed, cause a processor to perform various functions described herein. In some cases, the memory contains, among other things, a basic input/output system (BIOS) which controls basic hardware or software operation such as the interaction with peripheral components or devices. In some cases, a memory controller operates memory cells. For example, the memory controller can include a row decoder, column decoder, or both. In some cases, memory cells within a memory store information in the form of a logical state.

According to an embodiment of the present disclosure, the decoding circuitry may obtain PDCCH candidates by monitoring at least one search area from signals received from the transceiver 110. Additionally, decoding circuitry 122 may measure the reliability of each of the PDCCH candidates and may determine valid PDCCH candidates from among the PDCCH candidates based on the reliability. According to an embodiment, the decoding circuitry may generate an FBER for each PDCCH candidate for indicating reliability or may additionally generate an RFBER for each PDCCH candidate. In addition, the decoding circuitry may generate the quality of the LLR for each PDCCH candidate as an indication of reliability. The decoding circuitry may select at least one of the parameters indicating the reliability considering the power state of user equipment 100, the communication state with the base station, and the like. The decoding circuitry generates the selected at least one parameter and determines valid PDCCH candidates using the generated parameter. According to some embodiments, the decoding circuitry may be learned through machine learning to select the most appropriate parameter indicating the reliability of the PDCCH candidates in an environment depending on the current power state of the user equipment and the communication state with the base station.

Figure 3A:
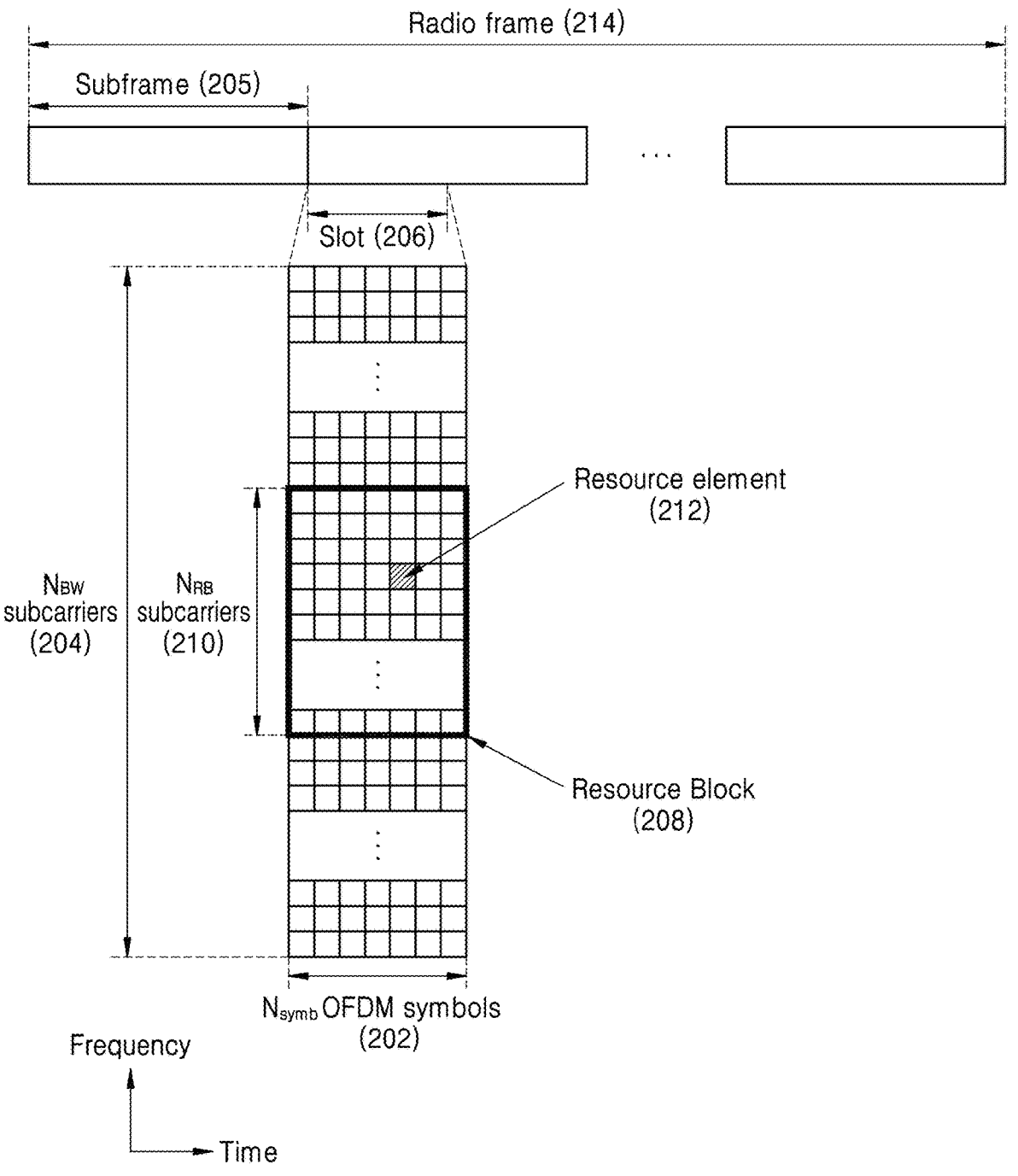
FIG. 3A is a diagram illustrating a structure of a time-frequency domain that is a radio resource area in a wireless communication system.
Figure 3B:
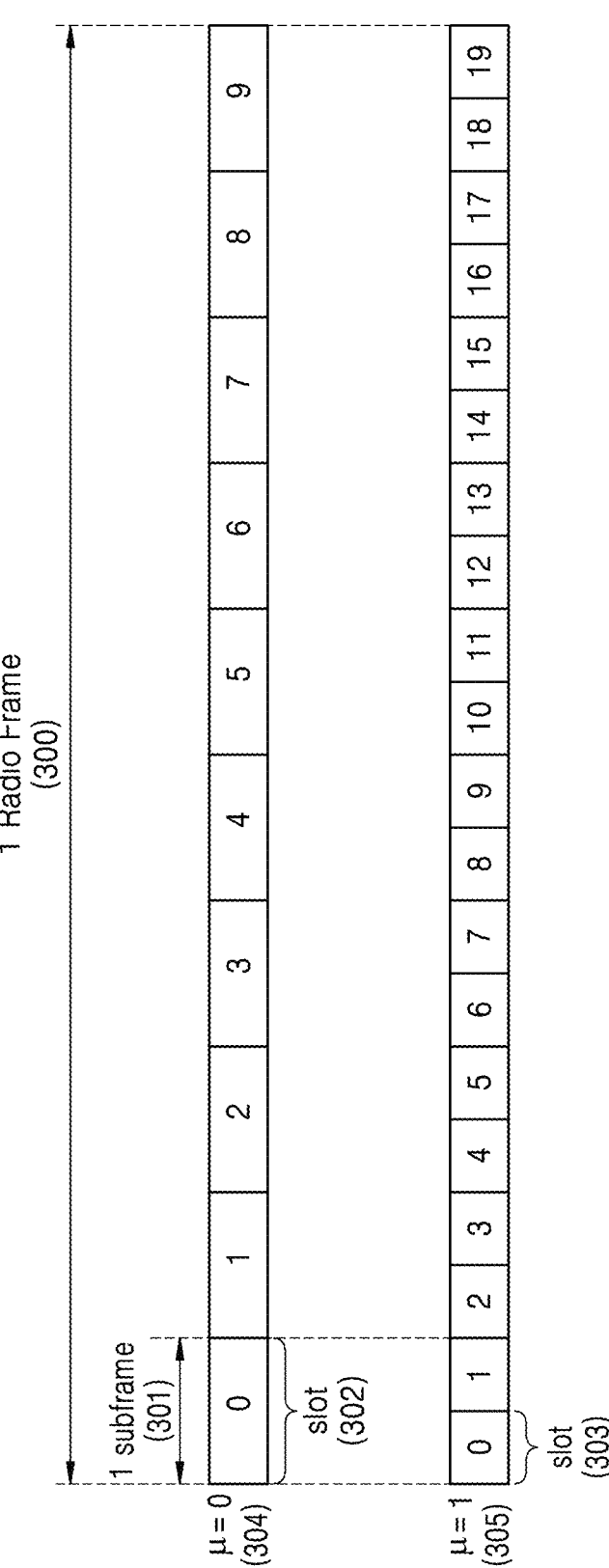
FIG. 3B is a diagram illustrating a slot structure in a wireless communication system.
Figure 3C:
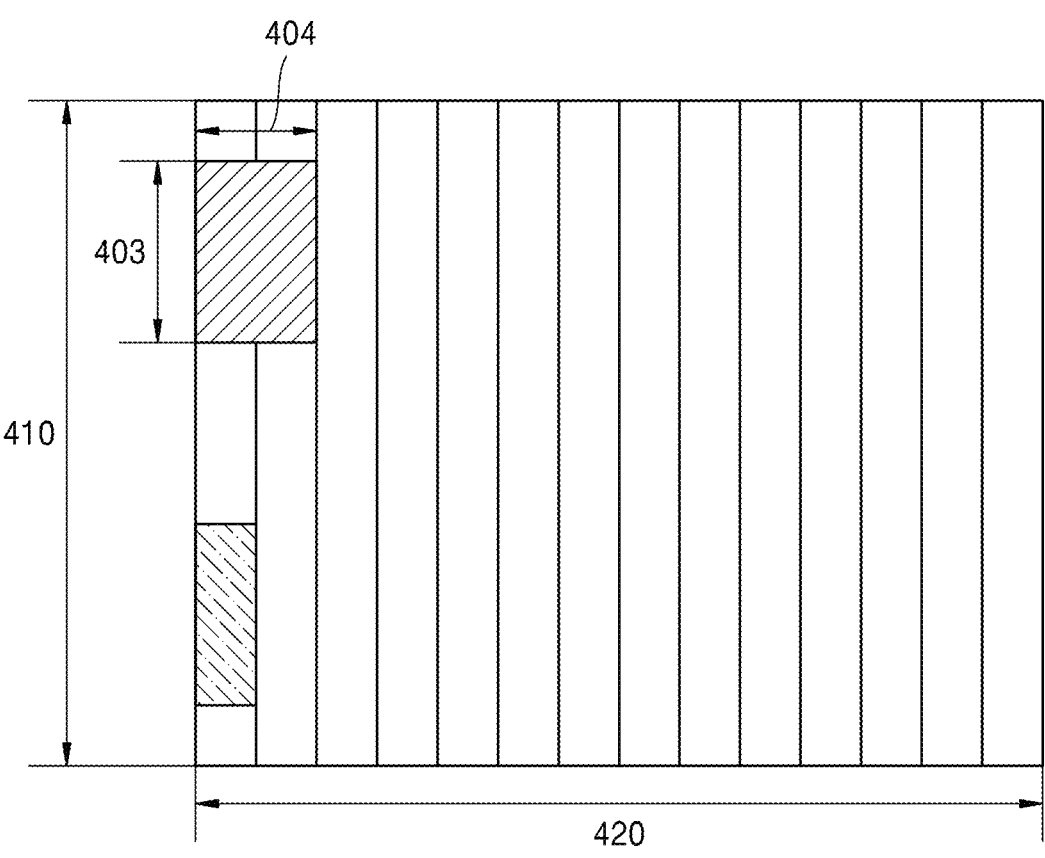
FIG. 3C is a diagram illustrating an example of a coreset in a wireless communication system.
Figure 3C:
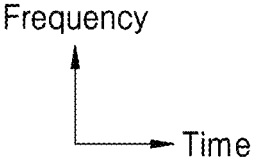
Figure 3D:
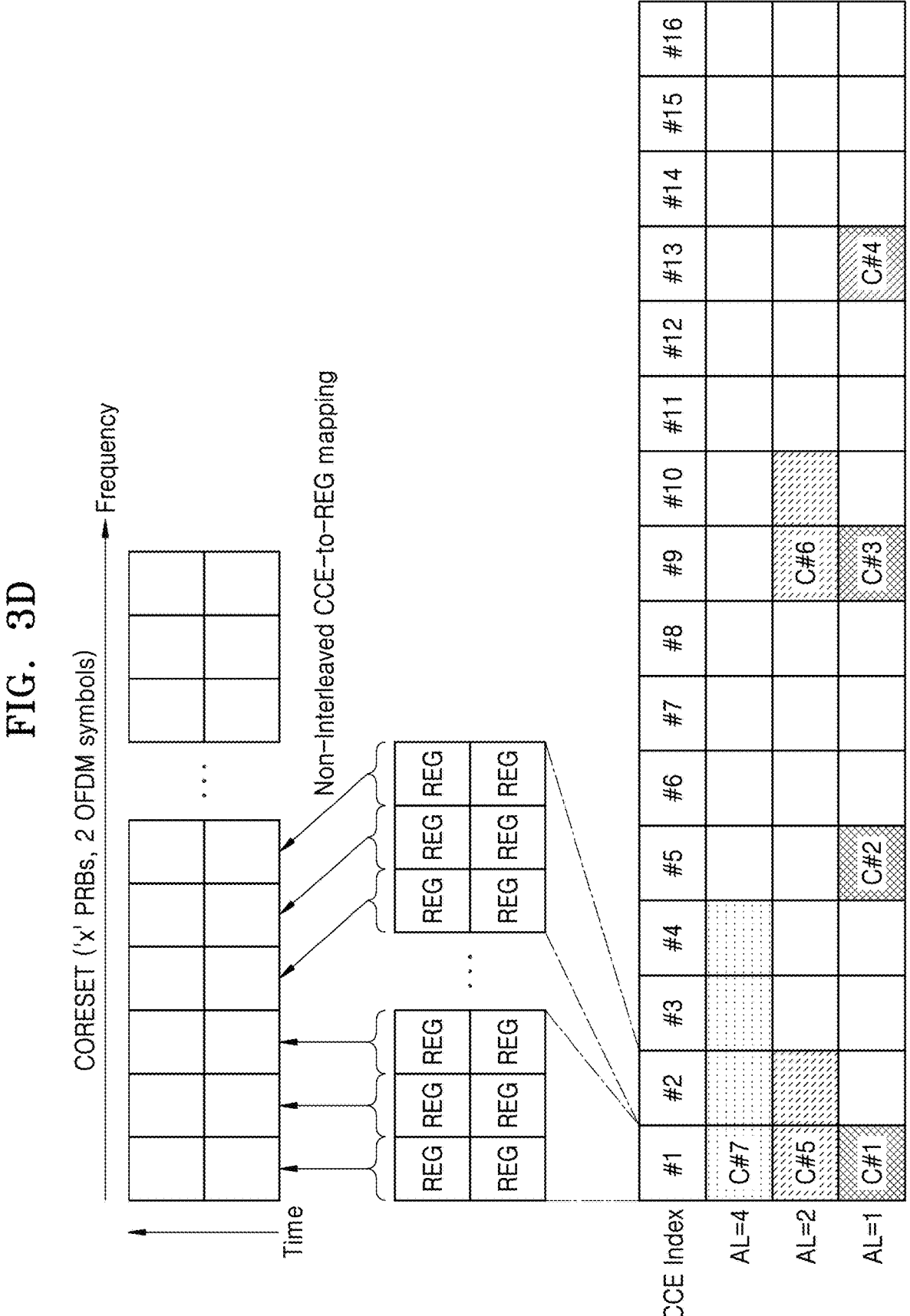
FIG. 3D is a diagram illustrating the structure of a coreset in a wireless communication system.

FIG. 3A is a diagram illustrating a structure of a time-frequency domain that is a radio resource area in a wireless communication system. FIG. 3B is a diagram illustrating a slot structure in a wireless communication system. FIG. 3C is a diagram illustrating an example of a coreset in a wireless communication system. FIG. 3D is a diagram illustrating the structure of a coreset in a wireless communication system. FIG. 3E is a table diagram illustrating the maximum number of PDCCH candidates based on subcarrier spacing in a single cell.

Referring to FIG. 3A, the horizontal axis may indicate a time domain and the vertical axis may indicate a frequency domain. The minimum transmission unit in the time domain is an orthogonal frequency division multiplexing (OFDM) symbol. Additionally, $N_{symb}$ OFDM symbols (202) may be gathered to configure one slot 206. Two slots may be gathered to configure one subframe 205. For example, the length of slot 206 may be 0.5 ms and the length of subframe 205 may be 1.0 ms. However, this is an example embodiment and the length of slot 206 may be variable depending on the configuration of the slot. The number of slots included in the subframe may vary depending on the length of the slots. A time-frequency domain may be defined based on the slot in the NR network. In addition, radio frame 214 may be a unit of time domain consisting of 10 subframes 205.

The minimum transmission unit in the frequency domain is a subcarrier and the bandwidth of the entire system transmission bandwidth may be composed of a total of $N_{BW}$ subcarriers (204). A basic unit of a resource in the time-frequency domain is a resource element (RE) 212 and may be represented by an OFDM symbol index and a subcarrier index. Resource block (RB) 208 may be defined as consecutive $N_{symb}$ OFDM symbols (202) in the time domain and consecutive $N_R$B subcarriers (210) in the frequency domain. Accordingly, one RB 208 may include $(N_{symb}*N_{RB})$ REs 212. An RB pair refers to concatenating two RBs on the time axis and may consist of $(N_{symb}*2N_{RB})$ REs 212.

As an example shown in FIG. 3A, search areas may exist in resources of the time-frequency domain and the user equipment may obtain PDCCH candidates by monitoring the search areas. The user equipment may sequentially determine whether the PDCCH candidates correspond to valid PDCCH candidates.

Further referring to FIG. 3B, one radio frame 300 may be defined as 10 ms, subframe 301 may be defined as 1 ms, and radio frame 300 may include a total of 10 subframes 301. Each slot 302 and 303 may be defined as 14 OFDM symbols. (i.e., the number of symbols per slot $$\left(N_{symb}^{slot}\right)$$

=14). One subframe 301 may consist of one or a plurality of slots and the number of slots per one subframe 301 may vary depending on the set values μ 304 and 305 for subcarrier spacing and the number of symbols included in the slots 302 and 303. As shown in FIG. 3B, a case of μ=0 (304) and a case of μ=1 (305) are shown as the subcarrier spacing setting values. When μ=0 (304) is used as a subcarrier spacing setting value, one subframe 301 may include one slot 302. Similarly, when μ=1 (305) is used as a subcarrier spacing setting value, one subframe 301 may include two slots 303.

Accordingly, the number of slots per one subframe may vary depending on the setting value μ for subcarrier spacing and the number of slots per frame may vary. The number of slots per one subframe $$\left(N_{slot}^{subframe,\mu}\right)$$

and the number of slots per one frame $$\left(N_{slot}^{frame,\mu}\right)$$

depending on a set value μ for each subcarrier spacing may be defined in Table 1.

TABLE 1

| μ | $N_{symb}^{slot}$ | $N_{slot}^{frame,\,\mu}$ | $N_{slot}^{subframe,\,\mu}$ |
|---|---|---|---|
| 0 | 14 | 10 | 1 |
| 1 | 14 | 20 | 2 |
| 2 | 14 | 40 | 4 |
| 3 | 14 | 80 | 8 |
| 4 | 14 | 160 | 16 |

According to some embodiments, the number of slots per one subframe may vary depending on the number of symbols included in one slot. For example, the set value μ u may be any one of 0, 1, 2, 3, and 4 and each value may indicate frequencies 15 kHz, 30 kHz, 60 kHz, 120 kHz, and 240 kHz.

The number of PDCCH candidates may vary depending on the set value μ for subcarrier spacing. According to an embodiment, the user equipment may perform selective blind decoding on set values μ for subcarrier spacing. In some cases, the user equipment may perform selective blind decoding at some set values μ for subcarrier spacing. Further details on performing selective blind decoding are described with reference to FIG. 3E.

Referring to FIG. 3C, bandwidth 410 in a frequency band corresponding to a single cell on the frequency axis and two coresets CORESET #1 and CORESET #2 in one slot 420 on the time axis may be set. The core sets CORESET #1 and CORESET #2 may be set in a specific frequency resource 403 within bandwidth 410 on the frequency axis. The core sets CORESET #1 and CORESET #2 may be set with one or a plurality of OFDM symbols on the time axis which may be defined as duration 404 of the core sets CORESET #1 and CORESET #2. For example, the first core set CORESET #1 may be set to have a length of two symbols, and the second core set CORESET #2 may be set to have a length of one symbol.

Further referring to FIG. 3D, the core set may include 'x' number of physical resource blocks (PRBs) on the frequency axis and two OFDM symbols on the time axis. In some cases, a core set CORESET may include a plurality of resource element groups (REG) and two REGs may constitute one REG bundle. For example, the REG may include 12 resource elements on the frequency axis and include one OFDM symbol on the time axis. A CCE may include six REGs. In some examples, REGs included in CCEs #1 to #16 may be referred to as non-interleaved CCE-to-REG mapping. According to some embodiments, REGs included in CCEs #1 to #16 may be referred to as interleaved CCE-to-REG mapping.

The junction level aggregation level (AL) may indicate the number of CCEs allocated for the PDCCH. Additionally, the number of PDCCH candidates may vary depending on the junction level. For example, when the junction level AL is 1, the first CCE #1, the fifth CCE #5, the ninth CCE #9, and the thirteenth CCE #13 may correspond to the first to fourth PDCCH candidates C #1, C #2, C #3, and C #4, respectively. When the junction level AL is 2, the first and second CCEs #1 and #2 may correspond to a fifth PDCCH candidate C #5, and the ninth and tenth CCEs #9 and #10 may correspond to a sixth PDCCH candidate C #6. When the junction level AL is 4, the first inner fourth CCEs #1, #2, #3, and #4 may correspond to the seventh PDCCH candidate C #7.

Thus, when three junction levels (AL=1, AL=2, and AL=3) are set in the coreset, three search areas may exist in the coreset since one search area corresponds to one junction level.

As an example shown in FIG. 3D, the user equipment may obtain 7 PDCCH candidates C #1 to C #7 by monitoring three search areas existing in the coreset and may generate reliability of seven PDCCH candidates C #1 to C #7 to determine valid PDCCH candidates based on the reliability. The user equipment may perform blind decoding on the determined valid PDCCH candidates. As a result, the efficiency of blind decoding of the user equipment may be improved.

In some cases, other coresets may be set and the user equipment may perform selective blind decoding on a plurality of PDCCH candidates existing in different coresets.

Referring to FIG. 3E, the maximum number of PDCCH candidates configured by the base station may vary depending on a set value for subcarrier spacing (SCS) and a slot type. For example, assuming that the slot type corresponds to the slot, when the set value for SCS is 15 KHz and the slot duration is 1000 s, the maximum number of PDCCH candidates may be set to 44. Similarly, when the set value for SCS is 30 KHz and the slot duration is 500 s, the maximum number of PDCCH candidates may be set to 36. When the set value for SCS is 60 KHz and the slot duration is 250 s, the maximum number of PDCCH candidates may be set to 22 and when the set value for subcarrier spacing SCS is 120 KHz and the slot duration is 125 s, the maximum number of PDCCH candidates may be set to 20. In some examples, assuming that the slot type corresponds to a non-slot, when the set value for SCS is 15 KHz and the minimum span duration is 142.86 s, the maximum number of PDCCH candidates may be set to 14. Similarly, when the setting value for SCS is 30 KHz for a non-slot slot type and the minimum span duration is 71.43 s, the maximum number of PDCCH candidates may be set to 12.

As shown in FIG. 3E, the maximum number of PDCCH candidates is for a single cell. The total maximum number of PDCCH candidates may increase depending on the number of cells when the base station operates a plurality of cells for communication with the user equipment. Thus, the base station may set the number of PDCCH candidates that are blind decoded by the user equipment considering the maximum number of PDCCH candidates depending on to the SCS setting value, the slot type, the slot duration, and the minimum span duration.

According to an embodiment, the user equipment may determine valid PDCCH candidates based on the reliability of the PDCCH candidates and may perform selective blind decoding on valid PDCCH candidates. The reliability may be generated based on a method depending on a coding scheme based on data communication between base station 12 and user equipment 14 or the quality of LLRs of PDCCH candidates.

The user equipment may determine whether to perform selective blind decoding or to perform blind decoding on all PDCCH candidates based on at least one of a set value of SCS, a slot type, a slot duration, and a minimum span duration. The user equipment may perform selective blind decoding only when the number of PDCCH candidates exceeds a threshold number. Additionally, the user equipment may perform selective blind decoding in the case of a communication environment requiring latency less than a threshold time. Hereinafter, a PDCCH candidate may be referred to as a candidate and a valid PDCCH candidate may be referred to as a valid candidate.

Figure 4:
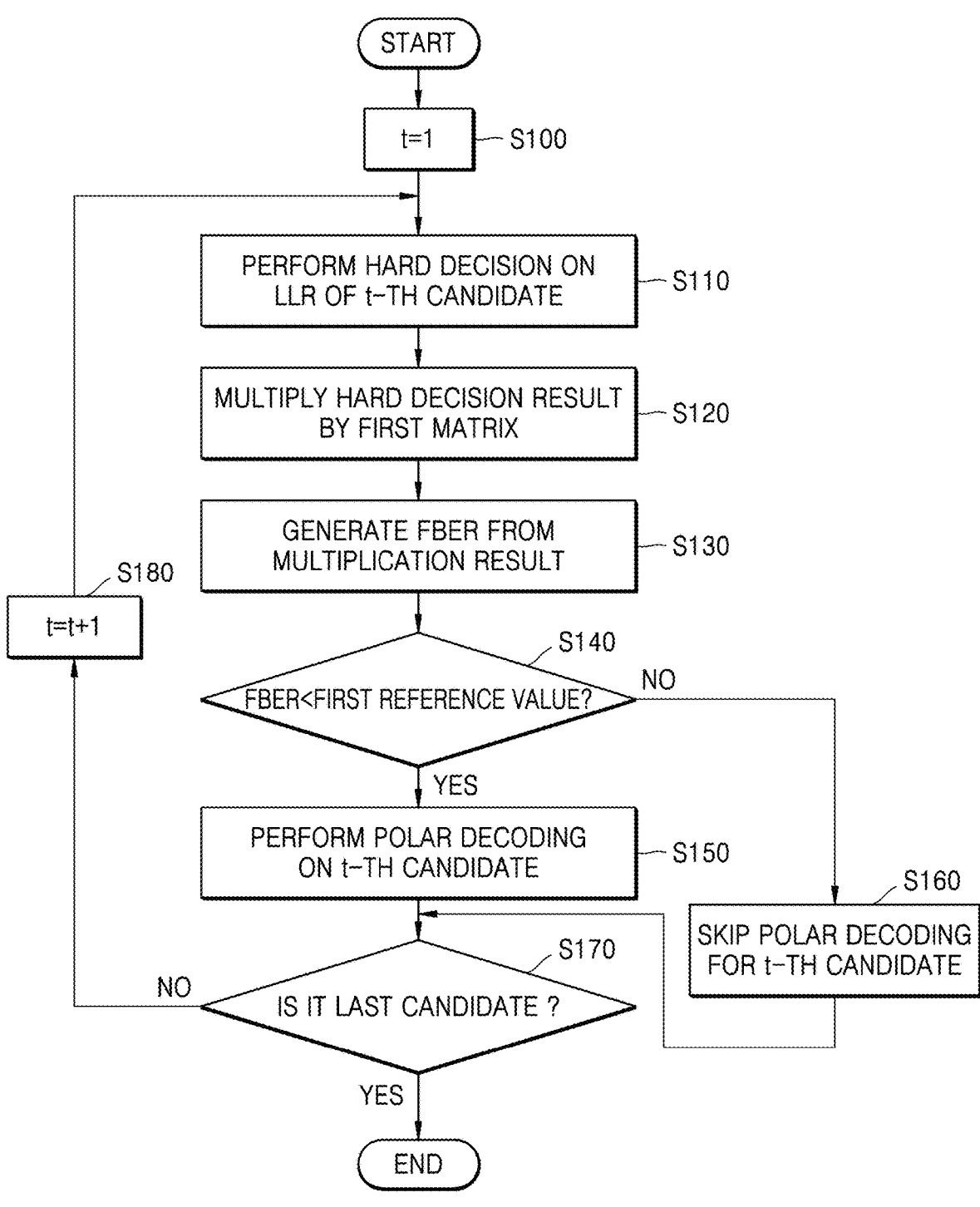
FIG. 4 is a flowchart illustrating a method of operating a user equipment according to an embodiment.

FIG. 4 is a flowchart illustrating a method of operating a user equipment according to an embodiment. FIG. 4 illustrates a method of operating a user equipment for generating an FBER and performing selective blind decoding using the FBER.

Referring to FIG. 4, in operation S100, the user equipment may set t to 1. In operation S110, the user equipment may perform a hard decision on the LLR of a t-th candidate. In operation S120, the user equipment may multiply the hard decision result by a first matrix. In some cases, the first matrix is a generator matrix used for polar encoding in the base station and may have a characteristic of a permutation matrix. In operation S130, the user equipment may generate the FBER of the t-th candidate from the multiplication result in S120.

According to an embodiment of the present disclosure, the user equipment may generate the number of frozen bit errors (FBEs) by counting the number of bits that are not 0 among frozen bits in the multiplication result. The user equipment may generate a ratio between the FBE and the number of frozen bits of the multiplication result as the FBER. In operation S140, the user equipment may compare the FBER with a first reference value to determine whether the FBER is less than the first reference value. When operation S140 is 'YES', the user equipment may determine that the t-th candidate is a valid candidate and perform polar decoding on the t-th candidate (operation S150). When operation S140 is 'NO', the user equipment may determine that the t-th candidate is not a valid candidate, and skip polar decoding for the t-th candidate (operation S160). In operation S170, the user equipment may determine whether the t-th candidate is the last candidate. When operation S170 is 'YES', the blind decoding is terminated, and when operation S170 is 'NO', the user equipment may count up t (t=t+1) and operation S110 follows.

According to an embodiment, the user equipment may determine candidates having an FBER less than the first reference value among the plurality of candidates as valid candidates and perform blind decoding on the valid candidates.

Figure 5:
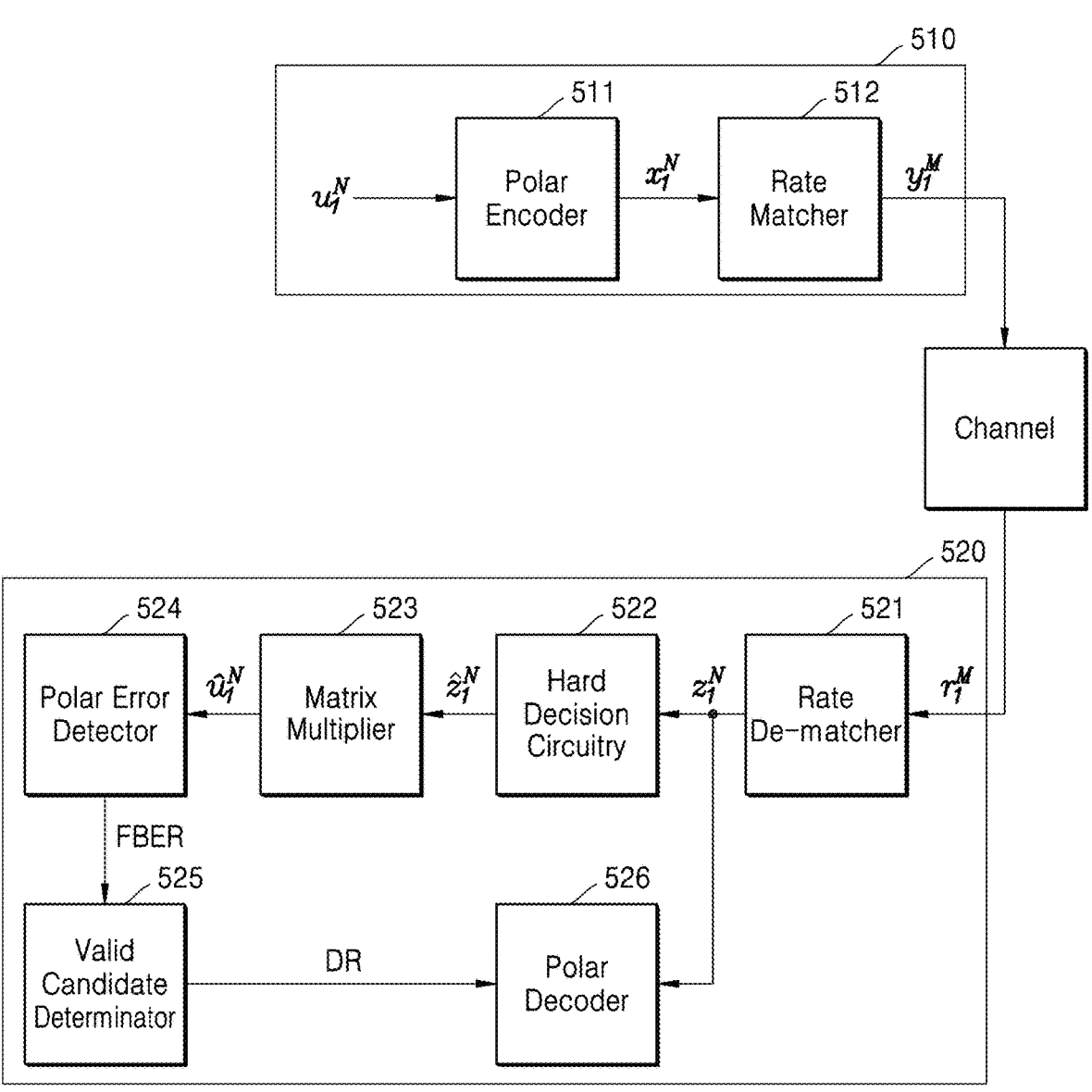
FIG. 5 is a block diagram illustrating operations of a base station and user equipment according to an embodiment.

FIG. 5 is a block diagram illustrating operations of base station 510 and user equipment 520. In FIG. 5, base station 510 and user equipment 520 configured with blocks for performing a series of operations are illustrated for better understanding, but it will be understood that the base station and the user equipment are not limited to the configuration example of FIG. 5. The base station and the user equipment may each include more blocks than shown in FIG. 5. Each operation of polar encoder 511 and rate matcher 512 of base station 510 may be performed by a processor or processing circuit included in base station 510. Similarly, the operation of each of a rate de-matcher 521, hard decision circuitry 522, matrix multiplier 523, polar error detector 524, valid candidate determinator 525, and polar decoder 526 of user equipment 520 may be performed by a processor or a processing circuit included in user equipment 520.

Referring to FIG. 5, base station 510 may include polar encoder 511 and rate matcher 512. A binary input sequence corresponding to one PDCCH candidate, $$u_1^N = (u_1, u_2, \ldots, u_N)$$

may be input to polar encoder 511. The polar encoder may polar encode $$u_1^N$$

to generate $$x_1^N,$$

14 which is a polar codeword. In some cases, $u_i$ may belong to A, which is an information set, or $A^c$, which is a frozen bit set. Accordingly, $u_i$ may correspond to $$u_1^N = \{A, A^c\}.$$

Polar encoding may be defined as Equation 1.

$$x_1^N = u_1^N G_N \qquad \text{[Equation 1]}$$

$G_2$ is a basic kernel matrix defined as $$\begin{bmatrix} 1 & 0 \\ 1 & 1 \end{bmatrix},$$

and $G_N$ may be the $n^{th}$ kronecker power of $G_2$. The polar encoding process when n is 1, 2, and 3 is specifically described with reference to FIG. 6.

The $$x_1^N$$

generated from polar encoder 511 may be input to rate matcher 512. The rate matcher may generate $$y_1^M$$

by performing rate matching on $$x_1^N \cdot y_1^M$$

may be transmitted from base station 510 to user equipment 520 via a channel using an additional modulation process. In the case of the PDCCH based on the NR network, the length of data $$(\text{e.g., } y_1^M)$$

may be adjusted by any one of puncturing, shortening, and repetition along with block interleaving. In the present specification, for convenience of description, a part of the data on which puncturing or shortening is performed is described assuming that the data is continuous and specific details thereof are described with reference to FIGS. 7A and 7B.

When the block size after rate matching on the base station side is M and the rate matching matrix is R, the size of R may be $$(N, M) \cdot y_1^M$$

may be defined as in Equation 2.

$$y_1^M = x_1^N R \qquad \text{[Equation 2]}$$

$$y_1^M$$

may be transmitted over the channel and the data $$r_1^M$$

received from user equipment 520 may be defined as in Equation 3.

$$r_1^M = H y_1^N + n \qquad \text{[Equation 3]}$$

Here, H may be a channel matrix, and n may be a noise vector. When the channel is additive white gaussian noise (AWGN), H may be an identity matrix.

User equipment 520 may include rate de-matcher 521, hard decision circuitry 522, matrix multiplier 523, polar error detector 524, valid candidate determinator 525, and polar decoder 526.

$$r_1^M$$

from a channel may be input to the rate de-matcher. The rate de-matcher may generate $$z_1^N$$

by performing rate de-matching on $$r_1^M \cdot z_1^N$$

may be input to the hard decision circuitry. The hard decision circuitry 522 may generate a hard decision sequence $$\hat{z}_1^N$$

by performing hard decision on $$z_1^N$$

having an LLR form. $\hat{z}_1$ included in $$\hat{z}_1^N$$

may be defined as in Equation 4.

$$\hat{z}_i = \begin{cases} 0 & \text{if } z_i \geq 1 \\ 1 & \text{otherwise} \end{cases}$$

Additionally, $$\hat{z}_1^N$$

may be defined as in Equation 5.

$$\hat{z}_1^N = x_1^N + e_1^N \qquad \text{[Equation 5]}$$

Here, $$e_1^N$$

may be an error sequence generated by noise of the channel.

$$\hat{z}_1^N$$

may be input to the matrix multiplier. The matrix multiplier may generate $$\hat{u}_1^N$$

by multiplying the generator matrix $G_N$ by $$\hat{z}_1^N \cdot \hat{u}_1^N$$

may be data obtained by estimating $$u_1^N$$

in a relatively simpler method than a polar decoding algorithm (e.g., CRC-aided successive cancelation list (CA-SCL)). In some embodiments, the operation of generating $$\hat{u}_1^N$$

17

18 may be referred to as polar quick decoding.

$$\hat{u}_1^N$$

may be defined as in Equation 6.

$$\hat{u}_1^N = \hat{z}_1^N G_N = \left(x_1^N + e_1^N\right)G_N = \qquad \text{[Equation 6]}$$

$$\left(u_1^N G_N + e_1^N\right)G_N = u_1^N G_N G_N + e_1^N G_N = u_1^N I_N + e_1^{N'}$$

Here, $G_N G_N = I_N$, and $$e_1^N G_N$$

may be defined as $$e_1^{N'} \cdot u_1^N$$

may be composed of normal bits and frozen bits and the frozen bits of $$u_1^N$$

may be previously reserved to have a value of '0'.

$$\hat{u}_1^N$$

may be input to the polar error detector. at least one of the frozen bits of $$\hat{u}_1^N$$

may be a '1' rather than '0' by $$e_1^{N'}.$$

The FBE may be defined as in Equation 7.

$$FBE = d\left(\hat{u}_1^N, 0\right) \text{ where } u_i \in A^c \qquad \text{[Equation 7]}$$

Here, $d(\bullet)$ may be a hamming distance and $A^c$ may be a frozen bit set. According to an embodiment, the FBE is input to the valid candidate determinator and the valid candidate determinator may determine whether the PDCCH candidate corresponding to $$\hat{u}_1^N$$

is a valid PDCCH candidate based on the FBE.

In some cases, the polar error detector may generate the FBER based on a ratio between the FBE and the number of frozen bits of $$\hat{u}_1^N.$$

The FBER is input to the valid candidate determinator 525 and the valid candidate determinator 525 may determine whether the PDCCH candidate corresponding to $$\hat{u}_1^N$$

is a valid PDCCH candidate based on the FBER.

The number of frozen bits of $$\hat{u}_1^N$$

for generating the FBER may be adjusted as in Equation 8.

$$\overline{FBE}_{random} = \qquad \text{[Equation 8]}$$

$$\frac{\text{Block length} - \text{Information Length} - CRC \text{ Length}}{2} = \frac{|A^c|}{2}$$

$\overline{FBE}_{random}$ may indicate a value at which FBEs of a plurality of PDCCH candidates are converged when a plurality of PDCCH candidates not including DCI are defined as random signals. $\overline{FBE}_{random}$ may have a value obtained by dividing the block length by subtracting the information length and the CRC length by 2, which may be a value obtained by dividing the number of frozen bits in $$\hat{u}_1^N h$$

by $|A^c|$. Thus, the FBER may be generated by dividing the FBE by $$\frac{|A^c|}{2}.$$

The FBER based on Equation 8 may be defined as Equation 9.

$$FBER = \frac{d(\hat{u}_1^N, 0)}{|A^c|/2} \text{ where } u_i \in A^c \qquad \text{[Equation 9]}$$

The FBER is input to valid candidate determinator 525. The valid candidate determinator may determine whether the corresponding PDCCH candidate is a valid PDCCH candidate based on the FBER and generate a determination result (DR). The valid candidate determinator may compare the FBER with a first reference value and determine the corresponding PDCCH candidate as a valid PDCCH candidate when the FBER is less than the first reference value.

The determination result DR is input to polar decoder 526 and the polar decoder may perform polar decoding on the corresponding PDCCH candidate based on the determination result DR. When the determination result DR indicates that the corresponding PDCCH candidate is a valid PDCCH candidate, the polar decoder may perform polar decoding on $$z_1^N$$

on the corresponding PDCCH candidate. The polar decoder may skip polar decoding for the corresponding PDCCH candidate when the determination result DR indicates that the corresponding PDCCH candidate is not a valid PDCCH candidate.

Figure 6:
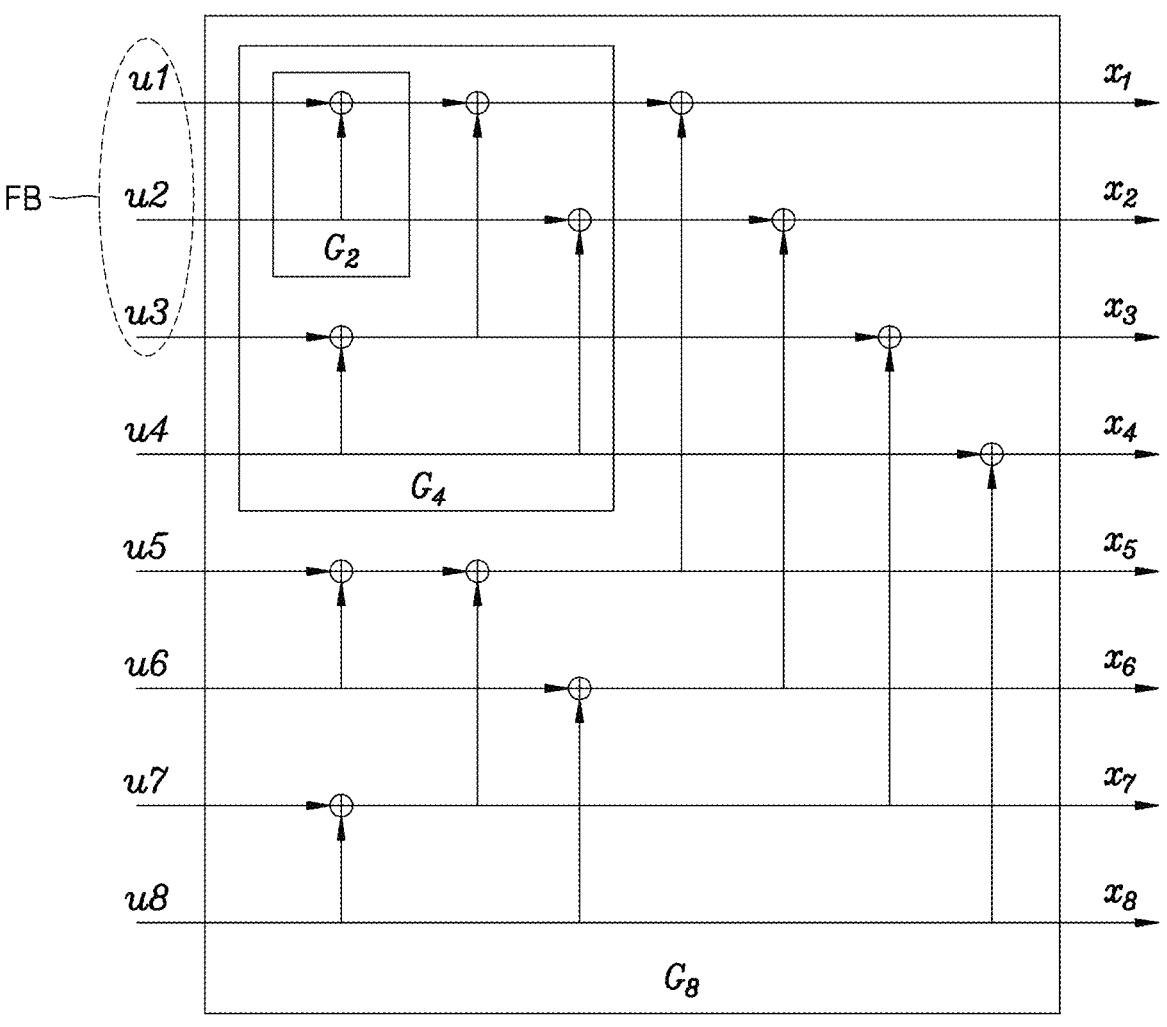
FIG. 6 is a diagram illustrating a configuration for polar encoding for describing a generator matrix according to an embodiment.

FIG. 6 is a diagram illustrating a configuration for polar encoding for describing a generator matrix. FIG. 6 shows a configuration for polar encoding including three generator matrices $G_2$, $G_4$, and $G_8$, but this is only an exemplary embodiment and a configuration for the polar encoding may include more generator matrices.

Referring to FIG. 6, data $$u_1^8$$

may include information bits $u_4$ to $u_8$ and frozen bits $u_1$ to $u_3$. For example, the values and positions of the frozen bits $u_1$ to $u_3$ may be previously agreed between the base station and the user equipment. The data $u_1^8$ may be polar-encoded depending on the generator matrices $G_2$, $G_4$, $G_8$ to be converted into a polar code (or a polar codeword). The polar code may include 8 bits, i.e., $x_1$ to $x_8$. Hereinafter, the polar code may be referred to as polar encoded data.

According to an embodiment of the present disclosure, the user equipment may generate the estimated data $$\hat{u}_1^8$$

by estimating the data $$u_1^8,$$

as described with reference to FIG. 5 and may generate an FBE or FBER by counting non-zero bits among frozen bits $\hat{u}_1$ to $\hat{u}_3$ of the estimated data $$\hat{u}_1^8.$$

Figure 7A:
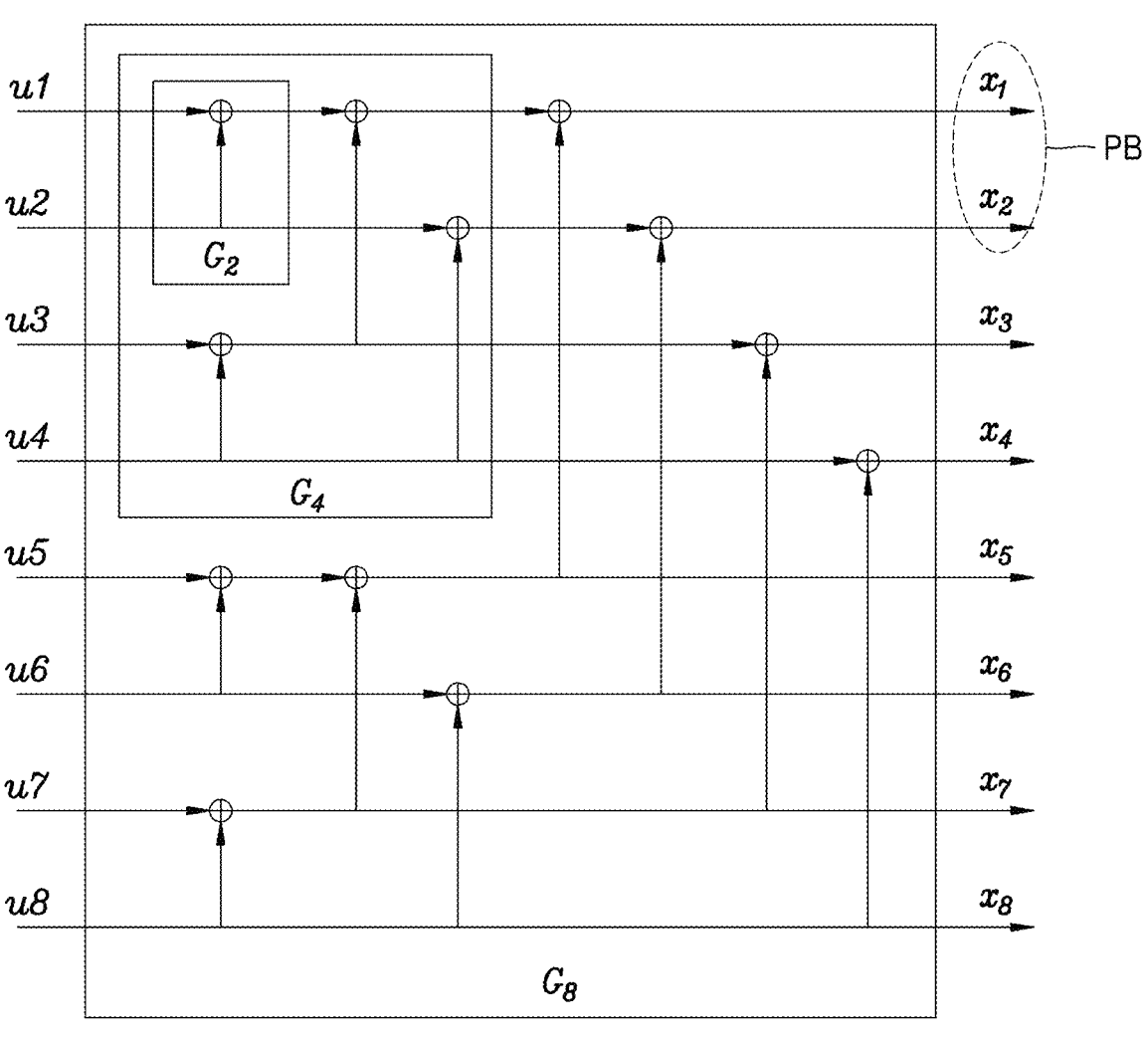
FIG. 7A is a diagram for explaining a method of generating an FBER when a puncturing technique is applied to a polar code according to an embodiment.
Figure 7B:
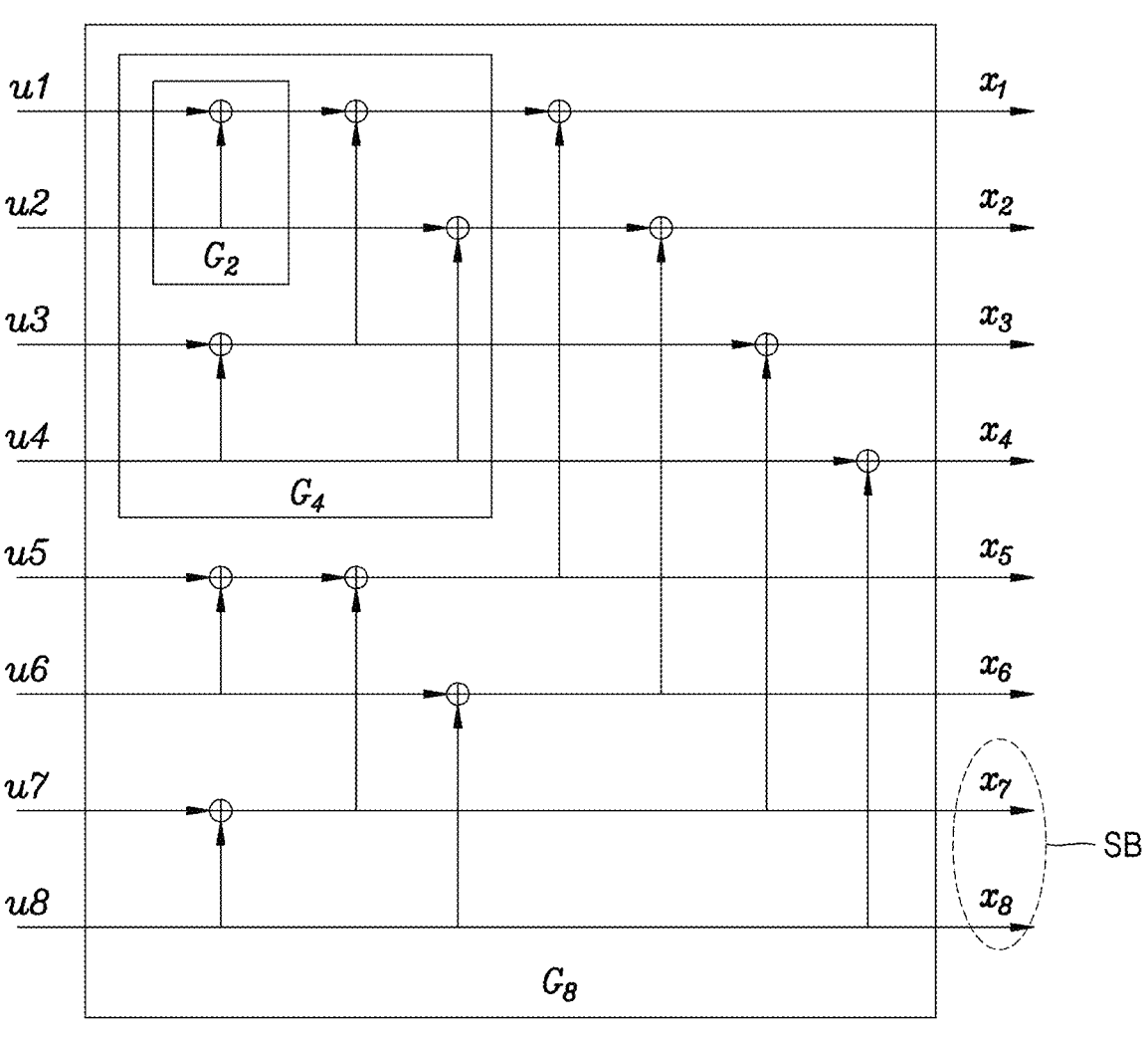
FIG. 7B is a diagram for explaining a method of generating an FBER when a shortening technique is applied to a polar code according to an embodiment.

FIG. 7A is a diagram for explaining a method of generating an FBER when a puncturing technique is applied to a polar code. FIG. 7B is a diagram for explaining a method of generating an FBER when a shortening technique is applied to a polar code.

Referring to FIG. 7A, the number of polar-encoded data may be adjusted by removing some of the preceding bits PB, i.e., $x_1$ and $x_2$ among bits $x_i$ to $x_8$, included in the polar-encoded data which may be defined as a puncturing scheme. The puncturing matrix $R^p$ based on the descriptions given with reference to FIG. 5 may be defined as in Equation 10.

$$R^p = \begin{bmatrix} 0 & 0 & \cdots & 0 \\ \vdots & & & \vdots \\ 0 & 0 & \cdots & 0 \\ 1 & 0 & \cdots & 0 \\ 0 & 1 & & 0 \\ \vdots & & \ddots & \vdots \\ 0 & 0 & \cdots & 1 \end{bmatrix} = \begin{bmatrix} 0_{(N-M)\times M} \\ I_M \end{bmatrix} \qquad \text{[Equation 10]}$$

When the puncturing technique is applied, $$y_1^M$$

transmitted from base station 510 in FIG. 5 may be defined as in Equation 11.

$$y_1^M = x_1^N R^p = (x_1, x_2, \dots, x_N) \begin{bmatrix} 0_{(N-M)\times M} \\ I_M \end{bmatrix} = \qquad \text{[Equation 11]}$$
$$(x_{N-M+1}, x_{N-M+2}, \dots, x_N) = (y_1, y_2, \dots, y_M)$$

After the $$r_1^M$$

received by user equipment 520 in FIG. 5 is rate de-matched by rate de-matcher 521, $$z_1^N$$

input to hard decision circuitry 522 may be defined as in Equation 12.

$$z_1^N = r_1^M R^{p^T} = (r_1, r_2, \dots, r_M)[0_{M\times(N-M)} \quad I_M] = \qquad \text{[Equation 12]}$$
$$(0, 0, \dots, 0, r_1, r_2, \dots, r_M)$$

$R^{p^T}$ may be a transposed matrix of the puncturing matrix $R^p$. Thereafter, $$z_1^N$$

may be hard determined by hard decision circuitry 522 in FIG. 5.

$$\hat{z}_1^N,$$

which is a hard decision sequence, may be defined as in Equation 13.

$$\hat{z}_1^N = (0, 0, \ldots, 0, \hat{z}_{(N-M)+1}, \hat{z}_{(N-M)+2}, \ldots, \hat{z}_N) = \quad \text{[Equation 13]}$$

$$(0, 0, \ldots, 0, x_{(N-M)+1}, x_{(N-M)+2}, \ldots, x_N) +$$

$$(0, 0, \ldots, 0, e_{(N-M)+1}, e_{(N-M)+2}, \ldots, e_N) =$$

$$x_1^N + e_1^N + (x_1, x_2, \ldots, x_{(N-M)}, 0, \ldots, 0) = x_1^N + e_1^N + xp_1^N$$

Here, $e_i$ corresponding to the error may be 0 in $1 \leq i \leq N-M$, and $$xp_1^N$$

may be defined as $$xp_1^N = (x_1, x_2, \ldots, x_{(N-M)}, 0, \ldots, 0).$$

$$\hat{z}_1^N$$

may be multiplied by the generator matrix $G_N$ by matrix multiplier 523 in FIG. 5, and $$\hat{u}_1^N$$

corresponding to the multiplication result may be defined as in Equation 14.

$$\hat{u}_1^N = \hat{z}_1^N G_N = (x_1^N + e_1^N + xp_1^N) G_N = u_1^N + e_1^{N'} + xp_1^N G_N \quad \text{[Equation 14]}$$

$$\hat{u}_1^{N-M}$$

is a punctured part which is affected by noise and $$u_{N-M+1}^N,$$

and may not be considered in the process of generating the FBE.

The FBE for the PDCCH candidate to which the puncturing technique is applied may be defined as in Equation 15.

$$FBE = d(\hat{u}_1^N, 0) \text{ where } u_i \in A^c \text{ and } u_i \notin P \quad \text{[Equation 15]}$$

Here, P is a set indicating the position of the punctured bit. Thus, the number of errors in the frozen bits corresponding to the punctured bits may be excluded from the FBE.

Referring to FIG. 7B, the number of bits of polar-encoded data may be adjusted by removing some last bits SB $x_7$ and $x_8$ of bits $x_1$ to $x_8$ included in the polar-encoded data which may be defined as a shortening technique. A shortening matrix $R^s$ based on the descriptions given with reference to FIG. 5 may be defined as in Equation 16.

$$R^s = \begin{bmatrix} 1 & 0 & \cdots & 0 \\ 0 & 1 & & 0 \\ \vdots & & \ddots & \vdots \\ 0 & 0 & \cdots & 1 \\ 0 & 0 & \cdots & 0 \\ \vdots & & & \vdots \\ 0 & 0 & \cdots & 0 \end{bmatrix} = \begin{bmatrix} I_M \\ 0_{(N-M) \times M} \end{bmatrix} \quad \text{[Equation 16]}$$

When the shortening technique is applied, $$y_1^M$$

transmitted from the base station 510 in FIG. 5 may be defined as in Equation 17.

$$y_1^M = x_1^N R^s = (x_1, x_2, \ldots, x_M) = (y_1, y_2, \ldots, y_M) \quad \text{[Equation 17]}$$

After the $$r_1^M$$

received by user equipment 520 of FIG. 5 is rate de-matched by rate de-matcher 521, $$z_1^N$$

input to hard decision circuitry 522 may be defined as in Equation 18.

$$z_1^N = r_1^M R^{s^T} \quad \text{[Equation 18]}$$

$R^{s^T}$ may be a transposed matrix of the shortening matrix $R^s$. Thereafter, $$z_1^N$$

may be hard determined by hard decision circuitry 522 in FIG. 5.

$$\hat{z}_1^N,$$

which is a hard decision sequence, may be defined as in Equation 19.

$$\hat{z}_1^N = \qquad\qquad \text{[Equation 19]}$$
$$(\hat{z}_1, \hat{z}_2, \dots, \hat{z}_M, 0, \dots, 0) = (x_1, x_2, \dots, x_M, 0, \dots, 0) +$$
$$(e_1, e_2, \dots, e_M, 0, \dots, 0) = x_1^N + e_1^N$$

Here, $e_i$ corresponding to the error may be 0 in $N-M+1 \leq i \leq N$, and the FBE for the PDCCH candidate to which the shortening technique is applied may be defined as in Equation 7.

Accordingly, when the puncturing technique is applied to the PDCCH candidate, the user equipment may generate the FBE. The user equipment may generate an FBE without counting errors of frozen bits corresponding to the punctured portion in the PDCCH candidate. Additionally, when the shortening technique is applied to the PDCCH candidate, the user equipment may generate the FBE as described with reference to FIG. 5.

Figure 8:
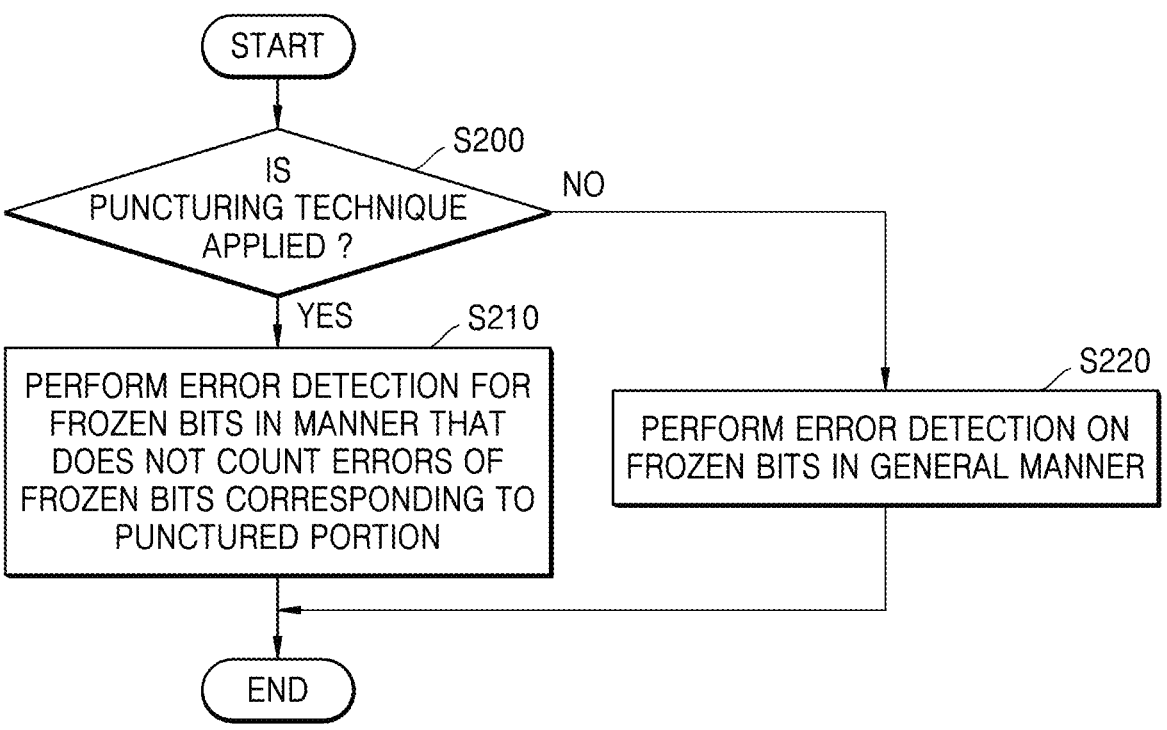
FIG. 8 is a flowchart illustrating an error detection method for frozen bits of a user equipment according to an embodiment.

FIG. 8 is a flowchart illustrating an error detection method for frozen bits of a user equipment.

Referring to FIG. 8, in operation S200, the user equipment may determine whether the puncturing technique is applied to data received from the base station. When operation S200 is 'YES', the user equipment may perform error detection for frozen bits in a manner that does not count errors of frozen bits corresponding to the punctured portion of the corresponding PDCCH candidate (operation S210). In some cases, operation S210 describes a method based on Equation 15 described with reference to FIG. 7A. When operation S200 is 'NO', the user equipment may perform error detection on the frozen bits in a general manner (operation S220). In some cases, operation S220 describes a method based on Equation 7 described with reference to FIG. 5.

Accordingly, when the puncturing technique is applied to the received data, the user equipment may perform error detection on the frozen bits of the PDCCH candidate considering whether the puncturing technique is applied.

Figure 9:
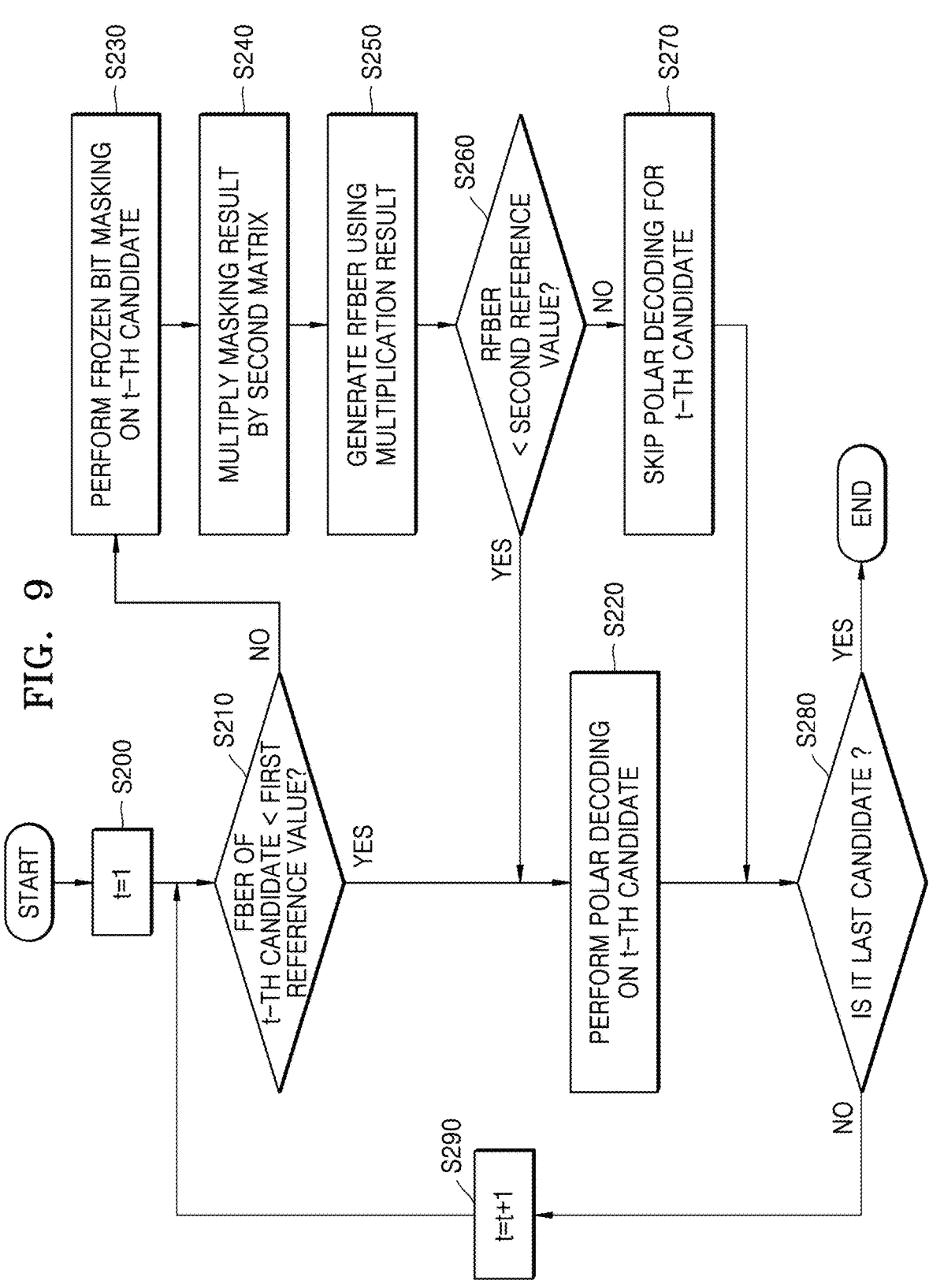
FIG. 9 is a flowchart illustrating a method of operating a user equipment according to an embodiment.

FIG. 9 is a flowchart illustrating a method of operating a user equipment, according to an embodiment. FIG. 9 illustrates an operation method of the user equipment that additionally generates an RFBER and performs selective blind decoding using the RFBER.

According to some embodiments, RFBER is additionally generated and used for selective blind decoding to compensate for a case when determining a valid candidate with the FBER may be difficult since the FBER becomes significantly large due to error propagation occurring in an arbitrary situation. Accordingly, even when the FBER is equal to or greater than a first reference value, the user equipment may additionally generate an RFBER of the corresponding candidate without directly skipping polar decoding for the corresponding candidate. Additionally, the user equipment may determine whether the corresponding candidate corresponds to a valid candidate based on the RFBER.

Referring to FIG. 9, in operation S200, the user equipment may set t to 1. In operation S210, the user equipment may compare the FBER of the t-th candidate with the first reference value to determine whether the FBER is less than the first reference value. When operation S210 is 'YES', the user equipment may determine that the t-th candidate is a valid candidate and perform polar decoding on the t-th candidate (operation S220). When operation S210 is 'NO', the user equipment may perform frozen bit masking on the t-th candidate (operation S230). In operation S240, the user equipment may multiply the masking result by the second matrix. According to an embodiment, the second matrix is a generator matrix used for polar encoding in the base station and may have a characteristic of a permutation matrix. In operation S250, the user equipment may generate the RFBER of the t-th candidate using the multiplication result of operation S240.

In some cases, the user equipment may count the number of bits having different values between the frozen bits in the multiplication result and the frozen bits in the hard decision result generated in the process of generating the FBER of operation S210. Additionally, the user equipment may generate a ratio between the counted number and the FBE of the t-th candidate as the RFBER. In operation S260, the user equipment may compare the RFBER of the t-th candidate with a second reference value to determine whether the RFBER is less than the second reference value. When operation S260 is 'YES', the user equipment may determine that the t-th candidate is not a valid candidate and skip polar decoding for the t-th candidate (operation S270). When operation S210 is 'YES' or operation S260 is 'NO', in following operation S220, the user equipment may determine that the t-th candidate is a valid candidate and perform polar decoding on the t-th candidate. In operation S280, the user equipment may determine whether the t-th candidate is the last candidate. When the operation S280 is 'YES', blind decoding is terminated, and when the operation S280 is 'NO', the user equipment may count up t (i.e., t=t+1) and then operation S210 may follow.

Figure 10:
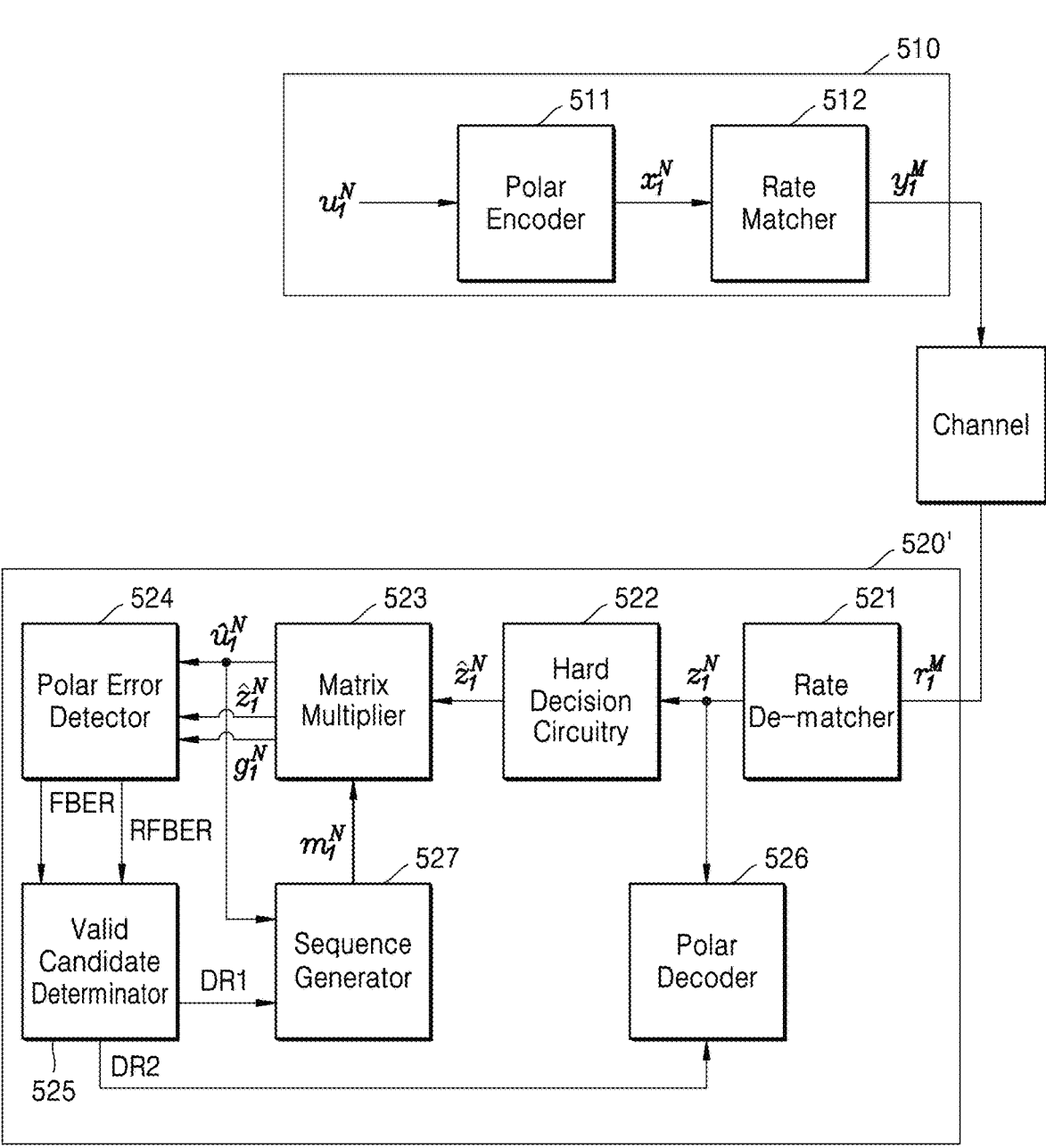
FIG. 10 is a block diagram illustrating operations of a base station and user equipment according to an embodiment.

FIG. 10 is a block diagram illustrating operations of base station 510 and user equipment 520'. For the description of FIG. 10, the description already provided with reference to FIG. 5 is omitted for brevity.

Compared to user equipment 520 in FIG. 5, user equipment 520' in FIG. 10 may further include a sequence generator 527. The operations of the sequence generator may be performed by a processor or processing circuit included in user equipment 520'. Hereinafter, when the FBER is equal to or greater than the first reference value, user equipment 520' that generates an RFBER is described.

Referring to FIG. 10, valid candidate determiner 525 may generate a first determination result DR1 when the FBER is equal to or greater than the first reference value and provide the first determination result DR1 to sequence generator 527. The sequence generator collectively converts the frozen bits of $$\hat{u}_1^N$$

input from matrix multiplier 523 into 0 in response to the first determination result DR1 to generate a masked sequence $$m_1^N.$$

The operation may be referred to as a frozen bit masking operation. $m_i$ included in $$m_1^N$$

may be defined as in Equation 20.

$$m_i = \begin{cases} 0 & \hat{u}_i \in A^c \\ \hat{u}_i & \hat{u}_i \notin A^c \end{cases} \qquad \text{[Equation 20]}$$

The sequence generator may generate $$g_1^N,$$

which is a regenerated sequence, by multiplying $$m_1^N$$

by $G_N$, which is a generator matrix.

$$g_1^N$$

may be defined as in Equation 21.

$$g_1^N = m_1^N G_N = \left( u_1^N + e_1^{N'} + e_{f_1^N} \right) G_N =$$

$$\left( u_1^N + e_1^N G_N + e_{f_1^N} \right) G_N = u_1^N G_N + e_1^N G_N G_N + e_{f_1^N} G_N =$$

$$x_1^N + e_1^N + e_{f_1^N} G_N = \hat{z}_1^N + e_{f_1^N} G_N$$

Here, $$e_{f_1^N}$$

may be an error sequence generated from frozen bits through a frozen bit masking operation based on Equation 20.

$$g_1^N$$

may be input to polar error detector 524, and the polar error detector compares $$g_1^N$$

with $$\hat{z}_1^N,$$

which is a hard decision sequence. Additionally, the polar error detector may count the number of bits having different values to generate an RFBE. The RFBE may be defined as Equation 22.

$$RFBE = d\left( g_1^N, \hat{z}_1^N \right) \text{ where } g_i \notin P \qquad \text{[Equation 22]}$$

When the small number of errors in $$z_1^N$$

input to hard decision circuit 522 or polar decoder 526 is increased by the error propagation generated by matrix multiplier 523, $$e_{f_1^N}$$

may have a regular pattern. Additionally, RFBE, which is the number of errors generated by regenerating $$e_{f_1^N},$$

may be less than FBE. In some cases, when $$z_1^N$$

includes multiple errors, RFBE and FBE, which are the number of errors generated by regenerating $$e_{f_1^N},$$

may be the same or similar to each other.

Therefore, the polar error detector may generate the RFBER which may be defined as in Equation 23.

$$RFBER = \frac{d\left( g_1^N, \hat{z}_1^N \right)}{FBE} \text{ where } g_i \notin P \qquad \text{[Equation 23]}$$

The polar error detector may generate RFBER by dividing RFBE by FBE, and the valid candidate determiner may generate a second determination result DR2 by determining whether the corresponding PDCCH candidate is a valid PDCCH candidate based on whether the RFBER is less than the second reference value. Thus, when RFBE and FBE are different from each other, i.e., when RFBE is significantly less than FBE, the valid candidate determiner may determine the corresponding PDCCH candidate as a valid PDCCH candidate. In some cases, the corresponding PDCCH candidate may be valid despite the high FBER of the corresponding PDCCH candidate considering that error propagation has occurred in $$\hat{u}_1^N.$$

The second determination result DR2 is input to polar decoder 526 and the polar decoder may perform polar decoding on the corresponding PDCCH candidate based on the second determination result DR2.

Figure 11:
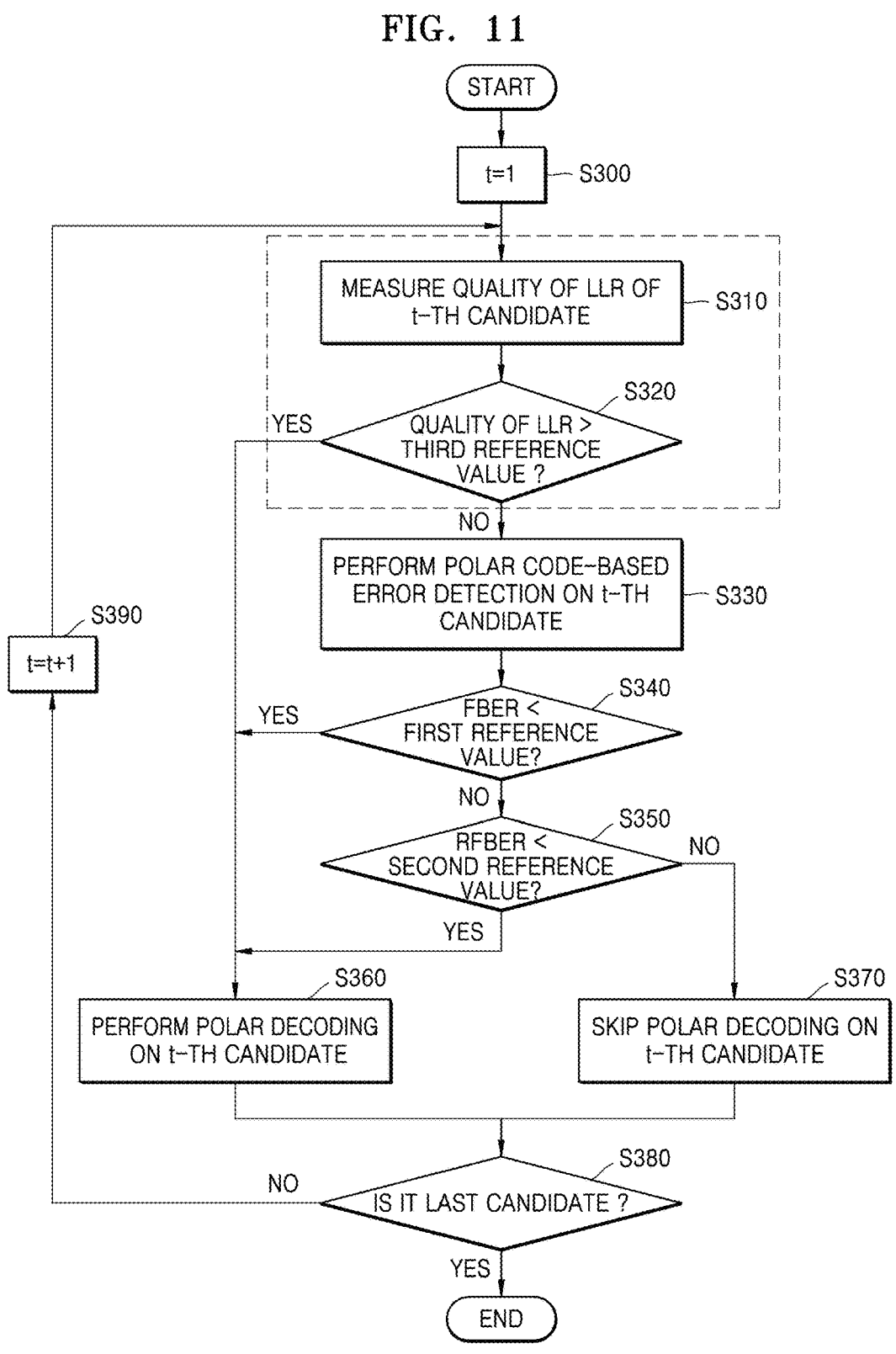
FIG. 11 is a flowchart illustrating a method of operating a user equipment according to an embodiment.

FIG. 11 is a flowchart illustrating a method of operating a user equipment. FIG. 11 illustrates a method of operating a user equipment for performing selective blind decoding by further considering the quality of the LLR of the t-th candidate.

Referring to FIG. 11, in operation S300, the user equipment may set t to 1. In operation S310, the user equipment may measure the quality of the LLR of the t-th candidate. According to an embodiment, the user equipment may determine the quality by measuring the magnitude of the LLR of the t-th candidate. In operation S320, the quality of the LLR of the t-th candidate may be compared with a third reference value to determine whether the third reference value is exceeded. The user equipment may recognize that the t-th candidate has high reliability with high quality of the LLR. As shown in FIG. 11, operations S310 and S320 included in the dashed line box are performed first, but this is only an example and the embodiments are not limited thereto, and may be performed between or after operations S330 to S350. When operation S320 is 'YES', the user equipment may perform polar decoding on the t-th candidate (operation S360). When operation S320 is 'NO', the user equipment may determine whether the FBER of the t-th candidate is less than the first reference value (operations S330 and S340). When operation S340 is 'NO', the user equipment may determine whether the RFBER of the t-th candidate is less than the second reference value (operation S350). When operation S350 is 'YES', the user equipment may perform polar decoding on the t-th candidate (operation S360) and when operation S350 is 'NO', the user equipment may skip polar decoding for the t-th candidate (operation S370). In operation S380, the user equipment may determine whether the t-th candidate is the last candidate. When the operation S380 is 'YES', the blind decoding is terminated, and when the operation S380 is 'NO', the user equipment may count up t (i.e., t=t+1) and operation S310 may be performed.

Figure 12:
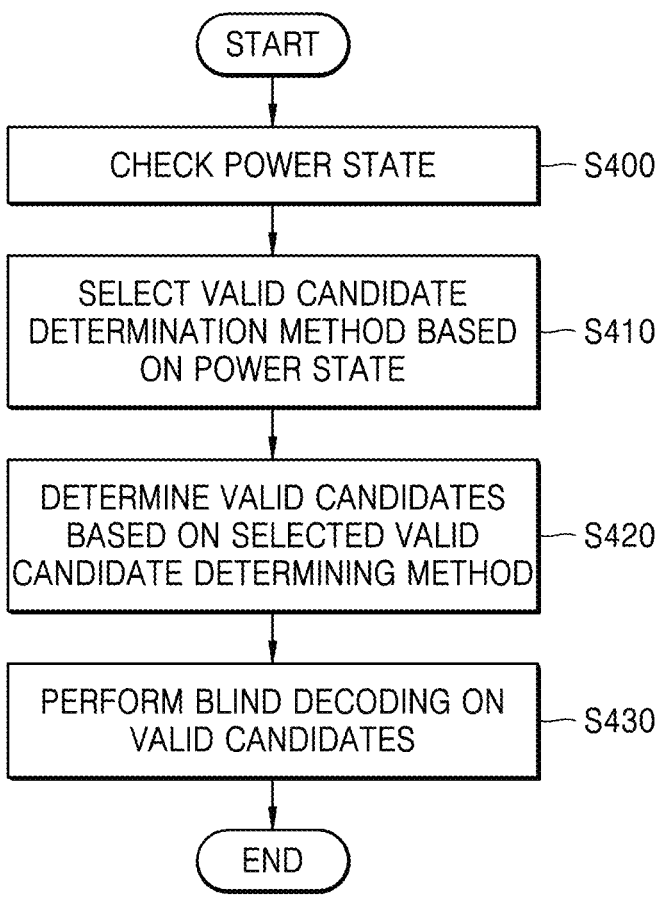
FIG. 12 is a flowchart illustrating a method of operating a user equipment according to an embodiment.

FIG. 12 is a flowchart illustrating a method of operating a user equipment.

Referring to FIG. 12, in operation S400, the user equipment may check a power state. According to an embodiment, the user equipment may determine the power state by checking the amount of power remaining in the user equipment battery. In operation S410, the user equipment may select a valid candidate determination method based on the power state. In some cases, the user equipment may select at least one of an effective candidate determination method based on FBER, a valid candidate determination method based on RFBER, and a valid candidate determination method based on LLR quality. For example, the user equipment may select any one of the three methods when the power state is bad, and may select at least two of the three methods when the power state is good. In operation S420, the user equipment may determine valid candidates from a plurality of candidates based on the selected valid candidate determining method. In operation S430, the user equipment may perform blind decoding on valid candidates.

Figure 13:
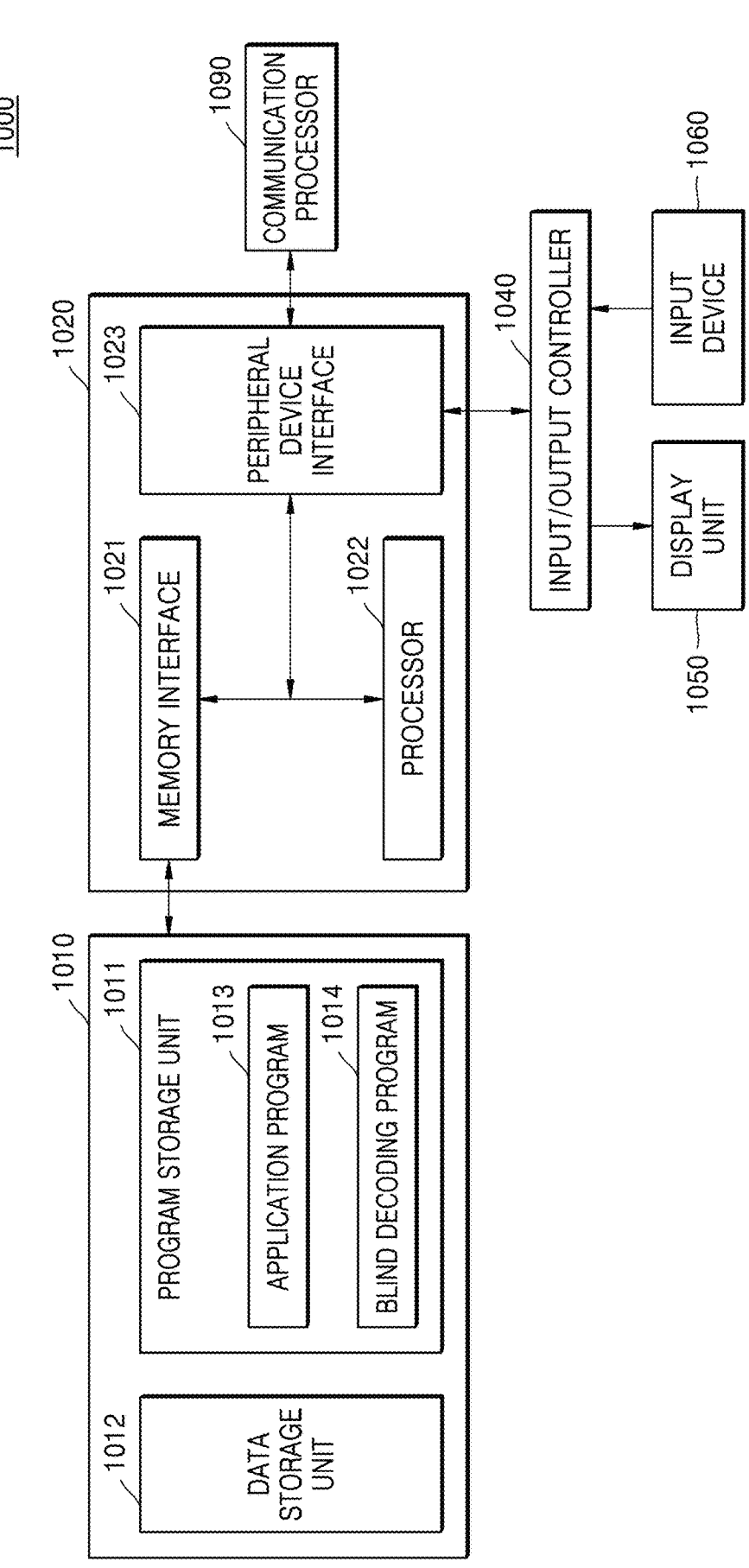
FIG. 13 is a block diagram illustrating an electronic device according to an embodiment.

FIG. 13 is a block diagram illustrating an electronic device 1000. The electronic device may be a user equipment.

Referring to FIG. 13, electronic device 1000 may include memory 1010, processor unit 1020, input/output controller 1040, display unit 1050, input device 1060, and communication processor 1090. Here, a plurality of memories 1010 may be provided.

The memory may include program storage unit 1011 for storing a program that controls the operation of the electronic device and data storage unit 1012 for storing data generated during program execution. The data storage unit may store data necessary for the operation of application program 1013 and blind decoding program 1014. In some cases, the data storage unit may store data generated from the operation of the application program and the blind decoding program.

The program storage unit may include application program 1013 and blind decoding program 1014. The program included in the program storage unit is a set of instructions and may be expressed as an instruction set. The application program may include program codes for executing various applications operating in the electronic device. The application program may include codes (or commands) related to various applications driven by processor 1022.

The blind decoding program may determine valid PDCCH candidates from among a plurality of PDCCH candidates based on the reliability of the plurality of PDCCH candidates. The blind decoding program may include program codes for performing selective blind decoding on valid PDCCH candidates. Processor 1022 may select reliability-related parameters and perform selective blind decoding based on the selection parameters by executing blind decoding program 1014.

Electronic device 1000 may include communication processor 1090 that performs communication functions for voice communication and data communication. Peripheral device interface 1023 may control the connection between input/output controller 1040, communication processing unit 1090, processor 1022, and memory interface 1021. The processor controls a plurality of base stations to provide a corresponding service using at least one software program. In some cases, the processor may execute at least one program stored in the memory to provide a service corresponding to the program.

The input/output controller may provide an interface between an input/output device, e.g., display unit 1050 and input device 1060, and peripheral device interface 1023. The display unit displays status information, input characters, moving pictures, and still pictures. For example, the display unit may display application program information driven by the processor.

The input device may provide input data generated by selection of the electronic device to the processor unit through the input/output controller. In some cases, the input device may include a keypad including at least one hardware button and a touch pad for sensing touch information. For example, the input device may provide touch information, such as a touch sensed through a touch pad, a touch movement, and a touch release, to the processor through the input/output controller.

Figure 14:
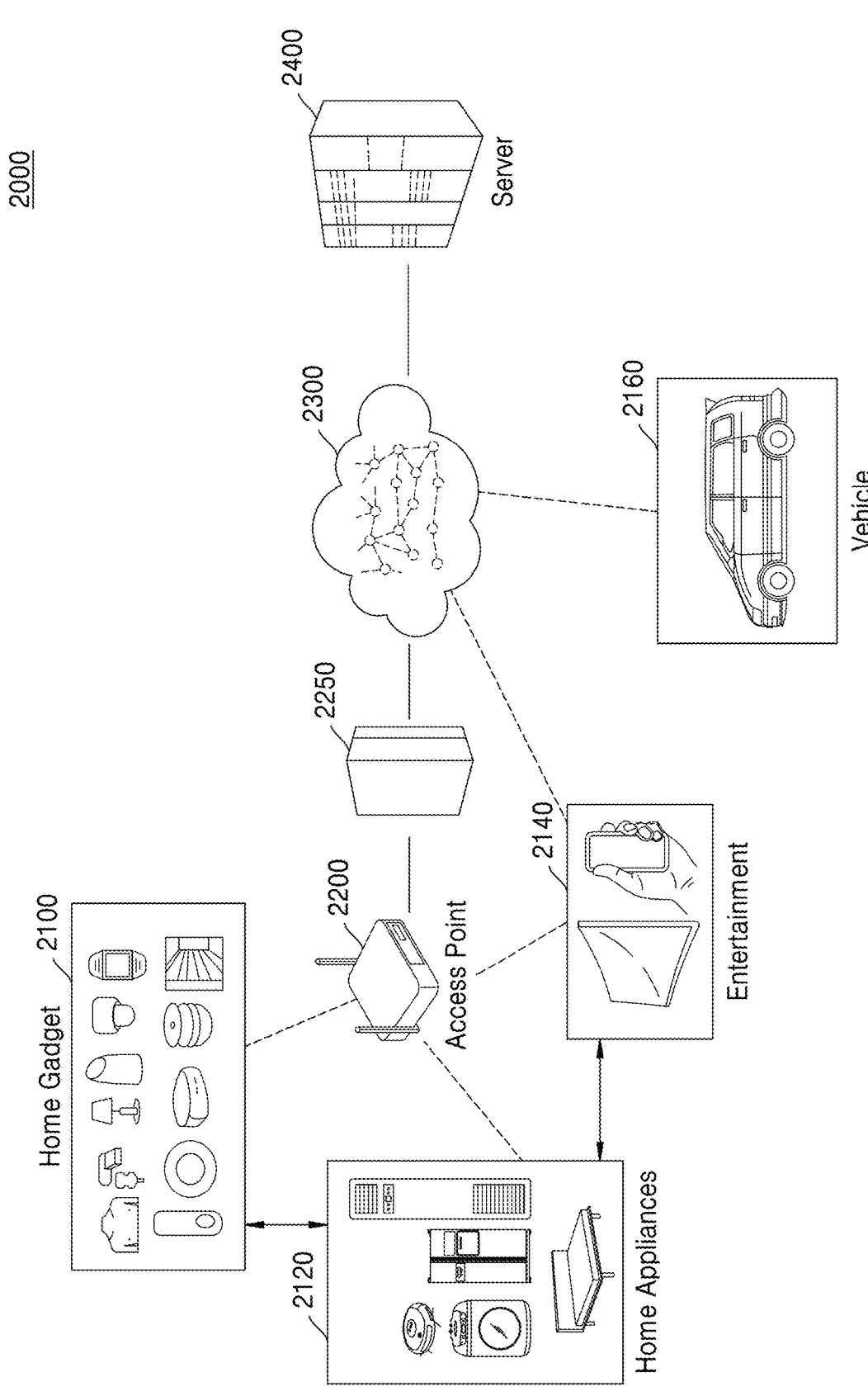
FIG. 14 is a conceptual diagram illustrating an IoT network system to which embodiments of the inventive concept are applied.

FIG. 14 is a conceptual diagram illustrating IoT network system 2000 to which embodiments of the present disclosure are applied.

Referring to FIG. 14, IoT network system 2000 may include a plurality of IoT devices 2100, 2120, 2140, 2160, access point 2200, gateway 2250, wireless network 2300, and server 2400. The internet of things (IoT) may refer to a network between objects using wired/wireless communication.

Each of the IoT devices 2100, 2120, 2140, and 2160 may form a group based on the characteristics of each IoT device. For example, the IoT devices may be grouped into home gadget group 2100, home appliance/furniture group 2120, entertainment group 2140, or vehicle group 2160. The plurality of IoT devices 2100, 2120, and 2140 may be connected to a communication network through access point 2200 or connected to other IoT devices. The access point 2200 may be embedded in one IoT device. Gateway 2250 may change a protocol to connect the access point to an external wireless network. The IoT devices 2100, 2120, and 2140 may be connected to an external communication network through the gateway. Wireless network 2300 may include the internet and/or a public network. The plurality of IoT devices 2100, 2120, 2140, and 2160 may be connected to server 2400 providing a predetermined service through wireless network 2300. A user may use a service through at least one of the plurality of IoT devices 2100, 2120, 2140, and 2160.

According to the embodiments of the present disclosure, the plurality of IoT devices 2100, 2120, 2140, and 2160 may determine valid PDCCH candidates from among the plurality of PDCCH candidates in consideration of the reliability of the PDCCH candidates, and may obtain control information necessary for communication by performing selective blind decoding on the valid PDCCH candidates.

While the present disclosure has been particularly shown and described with reference to embodiments thereof, it will be understood that various changes in form and details may be made therein without departing from the spirit and scope of the following claims.

The processes discussed above are intended to be illustrative and not limiting. One skilled in the art would appreciate that the steps of the processes discussed herein may be omitted, modified, combined, and/or rearranged, and any additional steps may be performed without departing from the scope of the invention. More generally, the above disclosure is meant to be exemplary and not limiting. Only the claims that follow are meant to set bounds as to what the present invention includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted, the systems and/or methods described above may be applied to, or used in accordance with, other systems and/or methods.

The invention claimed is:

1. A method of data communication, the method comprising:

obtaining a physical downlink control channel (PDCCH) candidate from at least one search area in a frequency band for the data communication;

performing error detection on frozen bits of the PDCCH candidate;

determining whether the PDCCH candidate is a valid PDCCH candidate based on a result of the error detection; and selectively performing polar decoding on the PDCCH candidate based on a determination result of the valid PDCCH candidate, wherein the performing of the error detection further comprises:

performing a hard decision on a log likelihood ratio (LLR) of the PDCCH candidate;

first multiplying a result of the hard decision by a generator matrix used for polar encoding; and generating a frozen bit error ratio (FBER) from a result of the first multiplying.

2. The method of claim 1, wherein generating the FBER comprises:

counting a first number of bits that are not zero among frozen bits in the result of the first multiplying; and generating a ratio between the counted first number and the number of frozen bits as the FBER.

3. The method of claim 2, wherein the number of frozen bits is variable depending on a bit size of DCI.

4. The method of claim 1, wherein:

determining whether the PDCCH candidate is a valid PDCCH candidate comprises comparing the FBER with a first reference value; and determining the PDCCH candidate as the valid PDCCH candidate when the FBER is less than the first reference value.

5. The method of claim 1, wherein, when the FBER is equal to or greater than a first reference value, performing of the error detection comprises performing frozen bit masking on the result of the first multiplying;

second multiplying a result of the frozen bit masking by the generator matrix; and generating a regenerated frozen bit error ratio (RFBER) from a result of the second multiplying.

6. The method of claim 5, wherein the generating the RFBER further comprises:

counting a second number of bits having different values between the frozen bits in a result of the second multiplying and the frozen bits in the hard decision result; and generating as the RFBER a ratio between the counted second number and a number of frozen bit errors of the PDCCH candidate.

7. The method of claim 5, wherein:

determining whether the PDCCH candidate is a valid PDCCH candidate comprises comparing the RFBER with a second reference value; and determining the PDCCH candidate as the valid PDCCH candidate when the RFBER is less than the second reference value.

8. The method of claim 1, wherein, in the selectively performing polar decoding on the PDCCH candidate when it is determined that the PDCCH candidate is not the valid PDCCH candidate, polar decoding for the PDCCH candidate is omitted, and when it is determined that the PDCCH candidate is the valid PDCCH candidate, the polar decoding is performed on the PDCCH candidate.

9. The method of claim 1, wherein the performing of the error detection comprises:

checking whether a puncturing technique is applied to the PDCCH candidate; and selectively excluding some of the frozen bits from detecting the error based on a result of the checking.

10. The method of claim 1, further comprising:
measuring a quality of a log likelihood ratio (LLR) of the PDCCH candidate; and
determining whether the PDCCH candidate is the valid PDCCH candidate based on the quality of the LLR.

11. The method of claim 10, wherein the determining whether the PDCCH candidate is the valid PDCCH candidate comprises comparing the quality of the LLR with a third reference value; and
determining the PDCCH candidate as the valid PDCCH candidate when the quality of the LLR exceeds the third reference value.

12. The method of claim 11, wherein,
the determining whether the PDCCH candidate is the valid PDCCH candidate based on the quality of the LLR is performed prior to the performing of the error detection and the determining whether the PDCCH candidate is the valid PDCCH candidate based on the error detection result; and
when the quality of the LLR exceeds the third reference value, the performing of the error detection and the determining whether the PDCCH candidate is the PDCCH valid candidate based on the error detection result are omitted.

13. A user equipment comprising:
a transceiver configured to receive data based on a polar code from a base station; and
a processor configured to perform error detection on frozen bits of a physical downlink control channel (PDCCH) candidate, determine whether the PDCCH candidate is a valid PDCCH candidate based on a result of the error detection, and perform selective polar decoding on the PDCCH candidate based on a determination result of the valid PDCCH candidate to obtain DCI from the data,
wherein the processor is configured to perform hard decision on a log likelihood ratio (LLR) of the PDCCH candidate, first multiply a result of the hard decision by a generator matrix used for polar encoding, generate a frozen bit error rate (FBER) from a result of the first multiplying, and determine whether the PDCCH candidate is the valid PDCCH candidate based on the FBER.

14. The user equipment of claim 13, wherein the FBER is a ratio between a first number of bits that are not zero among the frozen bits in the result of the first multiplication and the number of frozen bits.

15. The user equipment of claim 13, wherein the processor is configured to perform frozen bit masking on a result of the first multiplying, second multiply a result of the frozen bit masking by the generator matrix, generate a regenerated frozen bit error rate (RFBER) from a result of the second multiplication, and determine whether the PDCCH candidate is the valid PDCCH candidate by additionally considering the RFBER.

16. The user equipment of claim 15, wherein the RFBER is a ratio between a second number of bits having different values between frozen bits in a result of the second multiplication and frozen bits in a result of the hard decision and a number of frozen bit errors of the PDCCH candidate.

17. The user equipment of claim 13, wherein the processor is configured to measure a quality of a log likelihood ratio (LLR) of the PDCCH candidate and determine whether the PDCCH candidate is the valid PDCCH candidate by preferentially considering the quality of the LLR.

18. A method of a user equipment, the method comprising:
performing polar code-based error detection for each of a plurality of physical downlink control channel (PDCCH) candidates for obtaining DCI for data communication;
determining valid PDCCH candidates from among the plurality of PDCCH candidates based on a result of the error detection; and
performing blind decoding on the valid PDCCH candidates,
wherein for each of the plurality of PDCCH candidates, the performing of the polar code-based error detection comprises:
performing a hard decision on a log likelihood ratio (LLR) of the PDCCH candidate;
first multiplying a result of the hard decision by a generator matrix used for polar encoding; and
generating a frozen bit error ratio (FBER) from a result of the first multiplying.

19. The method of claim 18, wherein the generating of the FBER comprises:
counting a first number of bits that are not zero among frozen bits in the result of the first multiplying; and
generating a ratio between the counted first number and the number of frozen bits as the FBER.

* * * * *